(12) United States Patent
Lemoff et al.

(10) Patent No.: US 10,673,414 B2
(45) Date of Patent: Jun. 2, 2020

(54) ADAPTIVE TUNING OF A CONTACT LENS

(71) Applicant: Spy Eye, LLC, Los Gatos, CA (US)

(72) Inventors: Brian Elliot Lemoff, Morgan Hill, CA (US); Gregory David Miller, San Jose, CA (US); Ion Opris, San Jose, CA (US); Hawk Yin Pang, San Jose, CA (US)

(73) Assignee: Tectus Corporation, Saratoga, CA (US)

( * ) Notice: Subject to any disclaimer, the term of this patent is extended or adjusted under 35 U.S.C. 154(b) by 152 days.

(21) Appl. No.: 15/889,174

(22) Filed: Feb. 5, 2018

(65) Prior Publication Data

US 2019/0245523 A1   Aug. 8, 2019

(51) Int. Cl.
*H03J 3/24*       (2006.01)
*G02B 27/01*      (2006.01)
*G02C 7/04*       (2006.01)
*H02J 50/12*      (2016.01)
*G02C 11/00*      (2006.01)

(52) U.S. Cl.
CPC .............. *H03J 3/24* (2013.01); *G02B 27/017* (2013.01); *G02B 27/0172* (2013.01); *G02C 7/04* (2013.01); *G02C 11/10* (2013.01); *H02J 50/12* (2016.02)

(58) Field of Classification Search
CPC ........ H03J 3/24; H02J 50/12; G02B 27/0172; G02C 7/04; G02C 11/10
USPC .................................................. 351/159.02
See application file for complete search history.

(56) References Cited

U.S. PATENT DOCUMENTS

| 4,268,842 A | 5/1981 | Jacob et al. |
| 4,408,217 A | 10/1983 | Kobayashi et al. |
| 4,608,581 A | 8/1986 | Bagratishvili et al. |

(Continued)

FOREIGN PATENT DOCUMENTS

| CA | 2280022 | 1/2001 |
| GB | 1216075 A | 12/1970 |

(Continued)

OTHER PUBLICATIONS

Kao, H-L. et al., "DuoSkin: Rapidly Prototyping On-Skin User Interfaces Using Skin-Friendly Materials," ISWC'16, ACM, Sep. 12-16, 2016, 8 pages.

(Continued)

*Primary Examiner* — James R Greece
(74) *Attorney, Agent, or Firm* — Fenwick & West LLP

(57) ABSTRACT

An augmented reality system including a source and a contact lens display can be used to project information from the contact lens display onto the retina of the wearer's eye. The source provides energy to the contact lens display and operates at a source frequency. The source includes a source circuit including a conductive coil. The contact lens display includes a resonant circuit including another conductive coil and a capacitive circuit. The resonant circuit receives energy from the conductive coil of the source via a magnetic field inductively coupling the conductive coils. The contact lens display additionally includes a feedback circuit to adjust the capacitance of the capacitive circuit to control a resonant frequency of the resonant circuit. The feedback circuit can control the capacitive circuit to maintain the resonant frequency of the resonant circuit near the source frequency as the wearer's eye blinks.

20 Claims, 14 Drawing Sheets

(56) References Cited

U.S. PATENT DOCUMENTS

| | | | |
|---|---|---|---|
| 4,711,512 A | 12/1987 | Upatnieks | |
| 4,871,247 A | 10/1989 | Haynes | |
| 5,331,149 A | 7/1994 | Spitzer et al. | |
| 5,467,104 A | 11/1995 | Furness et al. | |
| 5,638,218 A | 6/1997 | Oomura | |
| 5,638,219 A | 6/1997 | Medina et al. | |
| 5,682,210 A | 10/1997 | Weirich | |
| 5,699,193 A | 12/1997 | Monno et al. | |
| 5,712,721 A | 1/1998 | Large | |
| 5,726,916 A | 3/1998 | Smyth | |
| 6,023,076 A | 2/2000 | Shibata | |
| 6,120,460 A * | 9/2000 | Abreu | A61B 3/1241 600/405 |
| 6,215,593 B1 | 4/2001 | Bruce | |
| 6,307,945 B1 | 10/2001 | Hall | |
| 6,312,393 B1 | 11/2001 | Abreu | |
| 6,410,940 B1 | 6/2002 | Jiang et al. | |
| 6,560,039 B1 | 5/2003 | Webb et al. | |
| 6,570,386 B2 | 5/2003 | Goldstein | |
| 6,823,171 B1 | 11/2004 | Kaario | |
| 6,851,805 B2 | 2/2005 | Blum et al. | |
| 6,920,283 B2 | 7/2005 | Goldstein | |
| 7,137,952 B2 | 11/2006 | Leonardi et al. | |
| 7,359,059 B2 | 4/2008 | Lust et al. | |
| 7,592,637 B2 | 9/2009 | Zimmerman et al. | |
| 7,626,562 B2 | 12/2009 | Iwasaki | |
| 7,758,187 B2 | 7/2010 | Amirparviz | |
| 7,809,417 B2 * | 10/2010 | Abreu | A61B 3/1241 600/318 |
| 7,835,056 B2 | 11/2010 | Doucet et al. | |
| 8,058,663 B2 | 11/2011 | Fan et al. | |
| 8,077,245 B2 | 12/2011 | Adamo et al. | |
| 8,087,777 B2 | 1/2012 | Rosenthal | |
| 8,096,654 B2 | 1/2012 | Amirparviz et al. | |
| 8,134,778 B2 | 3/2012 | Guyer | |
| 8,348,422 B2 | 1/2013 | Pugh et al. | |
| 8,348,424 B2 | 1/2013 | Pugh et al. | |
| 8,394,660 B2 | 3/2013 | Kim et al. | |
| 8,398,239 B2 | 3/2013 | Horning et al. | |
| 8,430,310 B1 | 4/2013 | Ho et al. | |
| 8,441,731 B2 | 5/2013 | Sprague | |
| 8,446,341 B2 | 5/2013 | Amirparviz et al. | |
| 8,482,858 B2 | 7/2013 | Sprague | |
| 8,520,309 B2 | 8/2013 | Sprague | |
| 8,526,879 B2 | 9/2013 | Kristiansen et al. | |
| 8,552,436 B2 | 10/2013 | Bibi et al. | |
| 8,571,789 B2 | 10/2013 | Monde et al. | |
| 8,579,434 B2 | 11/2013 | Amirparviz et al. | |
| 8,582,209 B1 | 11/2013 | Amirparviz | |
| 8,608,310 B2 | 12/2013 | Otis et al. | |
| 8,632,182 B2 | 1/2014 | Chen et al. | |
| 8,721,074 B2 | 5/2014 | Pugh et al. | |
| 8,764,185 B1 | 7/2014 | Biederman et al. | |
| 8,781,570 B2 | 7/2014 | Chuang et al. | |
| 8,786,520 B2 | 7/2014 | Legerton et al. | |
| 8,786,675 B2 | 7/2014 | Deering | |
| 8,798,332 B2 | 8/2014 | Otis et al. | |
| 8,827,445 B1 | 9/2014 | Wiser et al. | |
| 8,830,571 B1 | 9/2014 | Vizgaitis | |
| 8,870,370 B1 | 10/2014 | Otis et al. | |
| 8,874,182 B2 | 10/2014 | Etzkorn et al. | |
| 8,906,088 B2 | 12/2014 | Pugh et al. | |
| 8,911,078 B2 | 12/2014 | Meyers | |
| 8,922,898 B2 | 12/2014 | Legerton et al. | |
| 8,931,906 B2 | 1/2015 | Huang et al. | |
| 8,960,898 B1 | 2/2015 | Etzkorn et al. | |
| 8,963,268 B2 | 2/2015 | Kim et al. | |
| 8,964,298 B2 | 2/2015 | Haddick et al. | |
| 8,971,978 B2 | 3/2015 | Ho et al. | |
| 8,985,763 B1 | 3/2015 | Etzkorn et al. | |
| 8,989,834 B2 | 3/2015 | Ho et al. | |
| 9,000,000 B2 | 4/2015 | Carroll | |
| 9,028,068 B2 | 5/2015 | Chang | |
| 9,039,171 B2 | 5/2015 | Groisman | |
| 9,040,923 B2 | 5/2015 | Sprague et al. | |
| 9,041,025 B2 | 5/2015 | Lau et al. | |
| 9,047,512 B2 | 6/2015 | Otis et al. | |
| 9,047,818 B1 | 6/2015 | Day et al. | |
| 9,048,389 B2 | 6/2015 | Fu et al. | |
| 9,052,528 B2 | 6/2015 | Pugh et al. | |
| 9,052,533 B2 | 6/2015 | Pugh et al. | |
| 9,054,079 B2 | 6/2015 | Etzkorn | |
| 9,058,053 B2 | 6/2015 | Covington | |
| 9,063,351 B1 | 6/2015 | Ho et al. | |
| 9,063,352 B2 | 6/2015 | Ford et al. | |
| 9,111,473 B1 | 8/2015 | Ho et al. | |
| 9,130,099 B2 | 9/2015 | Robin | |
| 9,130,122 B2 | 9/2015 | Fu et al. | |
| 9,134,534 B2 | 9/2015 | Border et al. | |
| 9,134,546 B2 | 9/2015 | Pugh et al. | |
| 9,153,074 B2 | 10/2015 | Zhou et al. | |
| 9,158,133 B1 | 10/2015 | Pletcher et al. | |
| 9,161,712 B2 | 10/2015 | Etzkorn | |
| 9,170,646 B2 | 10/2015 | Toner et al. | |
| 9,178,107 B2 | 11/2015 | Tsai et al. | |
| 9,192,298 B2 | 11/2015 | Bouwstra et al. | |
| 9,195,075 B2 | 11/2015 | Pugh et al. | |
| 9,196,094 B2 | 11/2015 | Ur | |
| 9,215,293 B2 | 12/2015 | Miller | |
| 9,217,881 B2 | 12/2015 | Pugh et al. | |
| 9,225,375 B2 | 12/2015 | Pugh et al. | |
| 9,244,285 B2 | 1/2016 | Chen et al. | |
| 9,251,745 B2 | 2/2016 | Sprague | |
| 9,271,677 B2 | 3/2016 | Leonardi | |
| 9,282,920 B2 | 3/2016 | Ho et al. | |
| 9,289,123 B2 | 3/2016 | Weibel et al. | |
| 9,289,954 B2 | 3/2016 | Linhardt et al. | |
| 9,298,002 B2 | 3/2016 | Border et al. | |
| 9,298,020 B1 | 3/2016 | Etzkorn et al. | |
| D754,861 S | 4/2016 | O'Driscoll et al. | |
| 9,307,905 B2 | 4/2016 | Varel et al. | |
| 9,310,626 B2 | 4/2016 | Pugh et al. | |
| 9,316,848 B2 | 4/2016 | Pugh et al. | |
| 9,326,710 B1 | 5/2016 | Liu et al. | |
| 9,332,935 B2 | 5/2016 | Etzkorn et al. | |
| 9,335,562 B2 | 5/2016 | Pugh et al. | |
| 9,341,843 B2 | 5/2016 | Border et al. | |
| 9,366,872 B2 | 6/2016 | Honea et al. | |
| 9,366,881 B2 | 6/2016 | Pugh et al. | |
| 9,389,433 B2 | 7/2016 | Pugh et al. | |
| 9,401,454 B2 | 7/2016 | Robin et al. | |
| 9,414,746 B2 | 8/2016 | Bergman et al. | |
| 9,425,359 B2 | 8/2016 | Tsai et al. | |
| 9,442,307 B2 | 9/2016 | Meyers | |
| 9,442,310 B2 | 9/2016 | Biederman et al. | |
| 9,445,768 B2 | 9/2016 | Alexander et al. | |
| 9,523,865 B2 | 12/2016 | Pletcher et al. | |
| 9,629,774 B2 | 4/2017 | Dayal et al. | |
| 9,728,981 B2 * | 8/2017 | Lee | H02M 3/33507 |
| 9,939,658 B1 | 4/2018 | Gutierrez et al. | |
| 2002/0049389 A1 * | 4/2002 | Abreu | A61B 3/1241 600/558 |
| 2002/0140906 A1 | 10/2002 | Gibbon et al. | |
| 2002/0193674 A1 * | 12/2002 | Fleischman | A61B 3/16 600/399 |
| 2003/0139687 A1 * | 7/2003 | Abreu | A61B 3/1241 600/558 |
| 2004/0039297 A1 * | 2/2004 | Abreu | A61B 3/1241 600/558 |
| 2004/0039298 A1 * | 2/2004 | Abreu | A61B 3/1241 600/558 |
| 2005/0180687 A1 | 8/2005 | Amitai | |
| 2006/0055309 A1 | 3/2006 | Ono et al. | |
| 2006/0290882 A1 | 12/2006 | Meyers et al. | |
| 2007/0016074 A1 * | 1/2007 | Abreu | A61B 3/1241 600/475 |
| 2009/0066722 A1 | 3/2009 | Kriger et al. | |
| 2009/0189830 A1 | 7/2009 | Deering et al. | |
| 2010/0001926 A1 | 1/2010 | Amirparviz et al. | |
| 2010/0060553 A1 | 3/2010 | Zimmerman et al. | |
| 2010/0234717 A1 | 9/2010 | Wismer et al. | |
| 2011/0176205 A1 | 7/2011 | Shaw et al. | |
| 2011/0221659 A1 | 9/2011 | King et al. | |
| 2012/0154876 A1 | 6/2012 | Shimoda | |

(56) References Cited

U.S. PATENT DOCUMENTS

| | | |
|---|---|---|
| 2012/0223875 A1 | 9/2012 | Lau et al. |
| 2013/0050432 A1 | 2/2013 | Perez et al. |
| 2013/0100139 A1 | 4/2013 | Schliesser et al. |
| 2013/0126827 A1 | 5/2013 | Bibl et al. |
| 2013/0242077 A1 | 9/2013 | Lin et al. |
| 2013/0270664 A1 | 10/2013 | Kim et al. |
| 2013/0278631 A1 | 10/2013 | Border et al. |
| 2014/0016097 A1 | 1/2014 | Leonardi et al. |
| 2014/0063054 A1 | 3/2014 | Osterhout et al. |
| 2014/0070263 A1 | 3/2014 | Choi et al. |
| 2014/0098226 A1 | 4/2014 | Pletcher et al. |
| 2014/0118829 A1 | 5/2014 | Ma et al. |
| 2014/0192311 A1 | 7/2014 | Pletcher et al. |
| 2014/0198128 A1 | 7/2014 | Hong et al. |
| 2014/0240665 A1 | 8/2014 | Pugh et al. |
| 2014/0292620 A1 | 10/2014 | Lapstun et al. |
| 2015/0005604 A1 | 1/2015 | Biederman et al. |
| 2015/0016777 A1 | 1/2015 | Abovitz et al. |
| 2015/0057516 A1* | 2/2015 | Mujeeb-U-Rahman ..................... A61B 5/0538 600/346 |
| 2015/0060904 A1 | 3/2015 | Robin et al. |
| 2015/0062533 A1 | 3/2015 | Toner et al. |
| 2015/0088253 A1 | 3/2015 | Doll et al. |
| 2015/0126845 A1 | 5/2015 | Jin et al. |
| 2015/0145095 A1 | 5/2015 | Kim et al. |
| 2015/0150510 A1 | 6/2015 | Leonardi et al. |
| 2015/0171274 A1 | 6/2015 | Guo et al. |
| 2015/0223684 A1 | 8/2015 | Hinton et al. |
| 2015/0227735 A1 | 8/2015 | Chappell et al. |
| 2015/0234205 A1 | 8/2015 | Schowengerdt et al. |
| 2015/0235439 A1 | 8/2015 | Schowengerdt et al. |
| 2015/0235440 A1 | 8/2015 | Schowengerdt et al. |
| 2015/0235444 A1 | 8/2015 | Schowengerdt et al. |
| 2015/0235446 A1 | 8/2015 | Schowengerdt et al. |
| 2015/0235457 A1 | 8/2015 | Schowengerdt et al. |
| 2015/0235468 A1 | 8/2015 | Schowengerdt et al. |
| 2015/0235471 A1 | 8/2015 | Schowengerdt et al. |
| 2015/0241698 A1 | 8/2015 | Schowengerdt et al. |
| 2015/0243090 A1 | 8/2015 | Schowengerdt et al. |
| 2015/0261294 A1 | 9/2015 | Urbach et al. |
| 2015/0281411 A1 | 10/2015 | Markus et al. |
| 2015/0301338 A1 | 10/2015 | Van et al. |
| 2015/0312560 A1 | 10/2015 | Deering et al. |
| 2015/0339857 A1 | 11/2015 | O'Connor et al. |
| 2015/0362750 A1 | 12/2015 | Yeager et al. |
| 2015/0362752 A1 | 12/2015 | Linhardt et al. |
| 2015/0380461 A1 | 12/2015 | Robin et al. |
| 2015/0380988 A1 | 12/2015 | Chappell et al. |
| 2016/0011419 A1 | 1/2016 | Gao et al. |
| 2016/0018650 A1 | 1/2016 | Haddick et al. |
| 2016/0018651 A1 | 1/2016 | Haddick et al. |
| 2016/0018652 A1 | 1/2016 | Haddick et al. |
| 2016/0018653 A1 | 1/2016 | Haddick et al. |
| 2016/0030160 A1 | 2/2016 | Markus et al. |
| 2016/0049544 A1 | 2/2016 | Robin et al. |
| 2016/0062150 A1* | 3/2016 | Sako ........................ G02C 7/04 351/158 |
| 2016/0066825 A1 | 3/2016 | Barrows et al. |
| 2016/0080855 A1 | 3/2016 | Greenberg et al. |
| 2016/0081793 A1* | 3/2016 | Galstian ................... G02C 7/04 351/159.03 |
| 2016/0091737 A1 | 3/2016 | Kim et al. |
| 2016/0093666 A1 | 3/2016 | Gilet et al. |
| 2016/0097940 A1 | 4/2016 | Sako et al. |
| 2016/0113760 A1 | 4/2016 | Conrad et al. |
| 2016/0141449 A1 | 5/2016 | Robin et al. |
| 2016/0141469 A1 | 5/2016 | Robin et al. |
| 2016/0143728 A1 | 5/2016 | De et al. |
| 2016/0147301 A1 | 5/2016 | Iwasaki et al. |
| 2016/0154256 A1 | 6/2016 | Yajima et al. |
| 2016/0172536 A1 | 6/2016 | Tsai et al. |
| 2016/0172869 A1 | 6/2016 | Park et al. |
| 2016/0204307 A1 | 7/2016 | Robin et al. |
| 2016/0223842 A1 | 8/2016 | Yun et al. |
| 2016/0253831 A1 | 9/2016 | Schwarz et al. |
| 2016/0261142 A1 | 9/2016 | Park et al. |
| 2016/0270176 A1 | 9/2016 | Robin et al. |
| 2016/0270187 A1 | 9/2016 | Robin et al. |
| 2016/0276328 A1 | 9/2016 | Robin et al. |
| 2016/0299354 A1 | 10/2016 | Shtukater |
| 2017/0023793 A1 | 1/2017 | Shtukater |
| 2017/0042480 A1 | 2/2017 | Gandhi et al. |
| 2017/0086668 A1* | 3/2017 | Francois ................ A61B 3/113 |
| 2017/0168322 A1 | 6/2017 | Toner et al. |
| 2017/0270636 A1 | 9/2017 | Shtukater |
| 2017/0371184 A1 | 12/2017 | Shtukater |
| 2018/0036974 A1 | 2/2018 | Hahn et al. |
| 2019/0245523 A1* | 8/2019 | Lemoff .................... H02J 50/12 |

FOREIGN PATENT DOCUMENTS

| | | |
|---|---|---|
| WO | WO 2009/143802 A1 | 12/2009 |
| WO | WO 2016/014118 | 1/2016 |
| WO | WO 2016/022665 | 2/2016 |
| WO | WO 2016/079505 A1 | 5/2016 |
| WO | WO 2016/150630 A1 | 9/2016 |
| WO | WO 2016/195201 A1 | 12/2016 |

OTHER PUBLICATIONS

"8.2 All-Reflecting Two-Mirror Telescopes," Datasheet telescope-optics, telescope-optics.net, Aug. 3, 2016, 4 pages, [Online] [Retrieved on Dec. 14, 2017] Retrieved from the internet <URL: https://web.archive.org/web/20160803183105/http://www.telescope-optics.net/two-mirror.htm>.

Avago Technologies, "ADNE-2620 Optical Mouse Sensor Data Sheet," Mar. 27, 2008, 27 pages.

Choi, H.W. et al., "High-Resolution 128 x 96 Nitride Microdisplay," IEEE Electron Device Letters, May 2004, vol. 25, No. 5., pp. 277-279.

Day, J. et al., "III-Nitride Full-Scale High-Resolution Microdisplays," Applied Physics Letters, 2011, vol. 99, No. 031116, 2 pages.

Henry, W., "MicroLED Arrays Find Applications in the Very Small," Photonics Media, Mar. 2013, 7 pages.

Hernsdorf, J. et al., "Active-Matrix GaN Micro Light-Emitting Diode Display with Unprecedented Brightness," IEEE Transactions on Electron Devices, Jun. 2015, vol. 62, No. 6, pp. 1918-1925.

Kang, C-M. et al., "Fabrication of a Vertically-Stacked Passive-Matrix Micro-LED Array Structure for a Dual Color Display," Optics Express, Feb. 6, 2017, vol. 25, No. 3, 7 pages.

PCT International Search Report and Written Opinion, PCT Application No. PCT/US17/572.40, dated Jan. 12, 2018, 23 pages.

Peifu, G., "Design and Preparation of Quarter-Wave Plate Coatings," National Air Intelligence Center, May 12, 1995, 16 pages.

Song et al "Baffles design for the axial two-mirror telescope.", Optical Engineering, 2002, vol. 41, No. 9, pp. 2353-2357.

Tremblay, EJ, et al., "Ultrathin Cameras Using Annular Folded Optics," Applied Optics, Feb. 2007, vol. 46, No. 4. pp. 463-471.

United States Office Action, U.S. Appl. No. 15/570,707, dated Dec. 10, 2018, 40 pages.

United States Office Action, U.S. Appl. No. 15/894,712, dated Sep. 28, 2018 15 pages.

United States Office Action, U.S. Appl. No. 16/058,973, dated Dec. 10, 2018, 30 pages.

* cited by examiner

ADAPTIVE TUNING OF A CONTACT LENS

BACKGROUND

1. Technical Field

One or more embodiments of this disclosure relate to the capacitive tuning of an inductively coupled resonant circuit of a contact lens display.

2. Description of Related Art

Augmented reality (AR) adds computer-generated information to a person's view of the world around them. Worldwide spending on augmented reality continues to increase alongside increases in the technological capability of AR systems and devices. One type of proposed AR system includes eye-mounted display devices. Delivering power to an eye-mounted display device for an AR system is a challenging problem and an active area of development.

BRIEF DESCRIPTION OF THE DRAWINGS

Embodiments of the disclosure have other advantages and features which will be more readily apparent from the following detailed description and the appended claims, when taken in conjunction with the accompanying drawings, in which:

Figure 1:
FIG. 1 shows a person wearing an augmented reality system including a necklace.

The figures depict various embodiments for purposes of illustration only. One skilled in the art will readily recognize from the following discussion that alternative embodiments of the structures and methods illustrated herein may be employed without departing from the principles described herein.

DETAILED DESCRIPTION OF THE PREFERRED EMBODIMENTS

An augmented reality system can be used to assist a wearer of the augmented reality (AR) system in everyday interactions by projecting AR images from a contact lens display onto the retina of the wearer's eye. In some embodiments, the contact lens display is based on tiny projector(s), each one no larger than about one or two millimeters in any dimension, mounted inside a contact lens. Here, these small projectors are called "femtoprojectors" where "femto" is a suggestive, rather than literal, prefix. The femtoprojector in the contact lens projects an image to the user's retina. If the contact lens display is partially transparent, then the image from the femtoprojector is combined with the external scene viewed by the user though the contact lens, thus creating an augmented reality. The AR images from the femtoprojector are overlaid on the image of the external scene.

In some embodiments, the AR system includes a source that produces a time-varying magnetic field to provide energy to the femtoprojectors in the contact lens display. The source can be, for example, sources in the walls of a room, the structure of a vehicle, a portable electronic device, or any other source capable of producing a time-varying magnetic field and that is external to the contact lens. Further, the source can include any number or type of sources producing the time varying magnetic field (e.g., a wire loop carrying an alternating current, a conductor coupled to a time-varying current source, etc.). The contact lens display receives energy from the source to power elements of the contact lens display (e.g., a femtoprojector) and provide information to display onto the user's retina. Additionally, the contact lens display can include a resonant circuit having a conductive coil and a capacitive circuit that forms a LC tank with the conductive coil. The contact lens display is configured to periodically adjust the capacitance of the capacitive circuit, which tunes the resonant frequency of the resonant circuit such that energy is inductively coupled to the resonant circuit in a more efficient manner.

Here, as means of an example, a time-varying magnetic field is generated from a necklace (i.e., a source) worn about the neck of the wearer of the AR system. The necklace includes a conductive coil and time-varying current source which generates the time-varying magnetic field. The source provides energy to the contact lens display via the time-varying magnetic field, thereby resulting in wireless power transfer between the source and the contact lens displays. The contact lens display includes a resonant circuit with a conductive coil inductively coupled to the conductive coil of the necklace via the time-varying magnetic field. The inductive coupling between the source and the resonant circuit allows energy generated by the source to be transferred to the contact lens display. The contact lens display recovers energy from the inductively coupled source and resonant circuit. However, as the environment of the eye changes (e.g., the wearer's eye blinks, the eyeball rotates, the temperature changes, or the eyeball generates tears, etc.), the efficiency of the power transfer between the source and the resonant circuit fluctuates. Accordingly, the resonant circuit of the augmented reality system can include a tunable capacitance that can be adjusted to increase the efficiency of the power transfer. Generally, constantly tuning the resonant circuit works to maximize the voltage across the resonant circuit and increase the efficiency of power transfer between the source and the resonant circuit. However, at times, the efficiency of power transfer is not maintained at maximum levels for any number of reasons (i.e., misalignment between the source and the contact lens display, for example).

The figures and the following description relate to preferred embodiments by way of illustration only. It should be noted that from the following discussion, alternative embodiments of the structures and methods disclosed herein will be readily recognized as viable alternatives that may be employed without departing from the principles of what is claimed.

FIG. 1 shows a person wearing an augmented reality system 100. In the illustrated example, the source of the time varying magnetic field is necklace 110, but could be any other source of a time-varying magnetic field. Even though the necklace 110 is in plain sight, it may be designed to look like ordinary jewelry and therefore attracts no special notice. In some configurations, the necklace can be hidden underneath the wearer's clothes. Whatever the design of the necklace 110, it does not alter one's impression of the person wearing it. Her appearance other than the addition of the necklace 110 is not affected by the AR system. The necklace 110 is an example of a wearable device that can act as a source in an AR system 100.

Furthermore, the AR system of FIG. 1 does not disturb the wearer. The contact lens displays 120 may also function as regular contact lenses providing refractive eyesight correction if required. The necklace 110 is lightweight and does not need to be held in one's hand like a cell phone or tablet. When the contact lens displays 120 are not showing images, the wearer is hardly conscious of the AR system 100. When the AR system 100 is displaying images, reacting to speech or receiving messages, it provides functions like that of a smartphone but in a more natural way.

In the illustrated necklace of FIG. 1 the hardware elements are generally localized to a pendant of the necklace. The pendant may be an ornamental object hanging from the necklace 110 that is configured to enclose and conceal the hardware elements of the augmented reality system 100. In other configurations, the necklace 110 includes electronics distributed about the circumference of the necklace 110 which allows for a broader range of necklace designs (e.g., without a pendant) suitable to a variety of aesthetic tastes.

While the AR system 100 is illustrated with a necklace 110, in other embodiments the functions of the necklace 110 described herein can be integrated into another type of wearable device. As an example, the functionality of the necklace 110 can be embedded in a necktie, a scarf, a belt, the brim of a hat, the collar of a shirt, the hood of a jacket, the sleeve of a sweater, the front of a t-shirt, etc. Alternatively, the necklace 110 can be coupled to an external electronic device (not pictured) such as a smart phone and the coupled electronic device may facilitate functionality of the AR system 100. Further, functions of the necklace can be included in any other object configured to generate and emit a time-varying magnetic field (e.g., the wall of a building, the structure of a car, etc.).

Figure 2A:
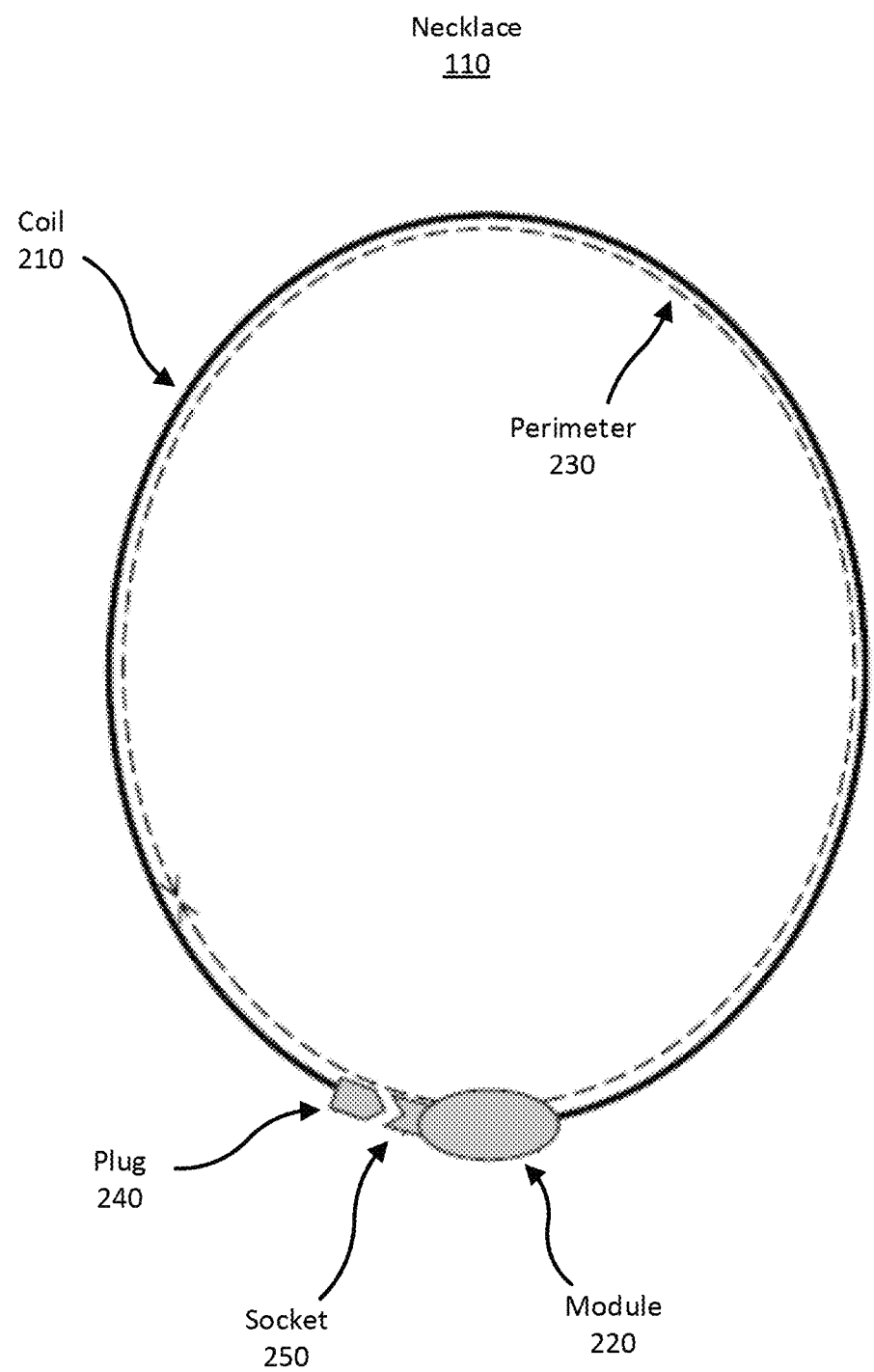
FIG. 2A shows a necklace of an augmented reality system.

FIG. 2A shows a source of a time-varying magnetic field of an unobtrusive AR system. In the illustrated example, the source is necklace 110, but can be any other source of time-varying magnetic field. Necklace 110 includes a coil 210 of conductive material such as an insulated wire and an electronic module 220. Module 220 contains the hardware elements for controlling the augmented reality system 100. In some configurations, the module 220 is a pendant of the necklace. In other configurations, the necklace 110 does not include a module 220 and the hardware elements are distributed about the perimeter 230 of the necklace. In some cases, the perimeter 230 of the necklace can be a circumference of the necklace.

Additionally, the number of conductive turns in necklace coil 210 is chosen considering factors such as power requirements of contact lens displays 120, operating frequency, etc. The number of turns in necklace coil 210 can be, for example, between 1 and 200 turns. In some configurations, an unlicensed frequency band can be used to couple the necklace 110 to the contact lens display 120, but any other frequency can be used. In one example, the system can use an industrial, scientific, and medical radio band (ISM).

Furthermore, conductors in the coil 210 may extend around the perimeter 230 of the necklace 110 for one, two, three, or more turns. These turns may be connected or disconnected with a plug 240 and socket 250 when putting the necklace 110 on or taking it off. Connecting the plug 240 to the socket 250 allows data and power to be transmitted between the necklace 110 and contact lens display 120, and disconnecting the plug 240 from the socket 250 prevents data and power from being transmitted between the necklace 110 and contact lens display 120. Generally, the coil 210 is configured to be worn around a user's neck as a necklace 110 when the plug 240 and socket 250 are connected. In some configurations, the necklace 110 does not include a plug and socket but still allows for data and power to be transmitted between the necklace 110 and contact lens display 120. In these configurations, any other means of controlling data and power transfer can be included (e.g., a switch, a button, etc.).

Figure 2B:
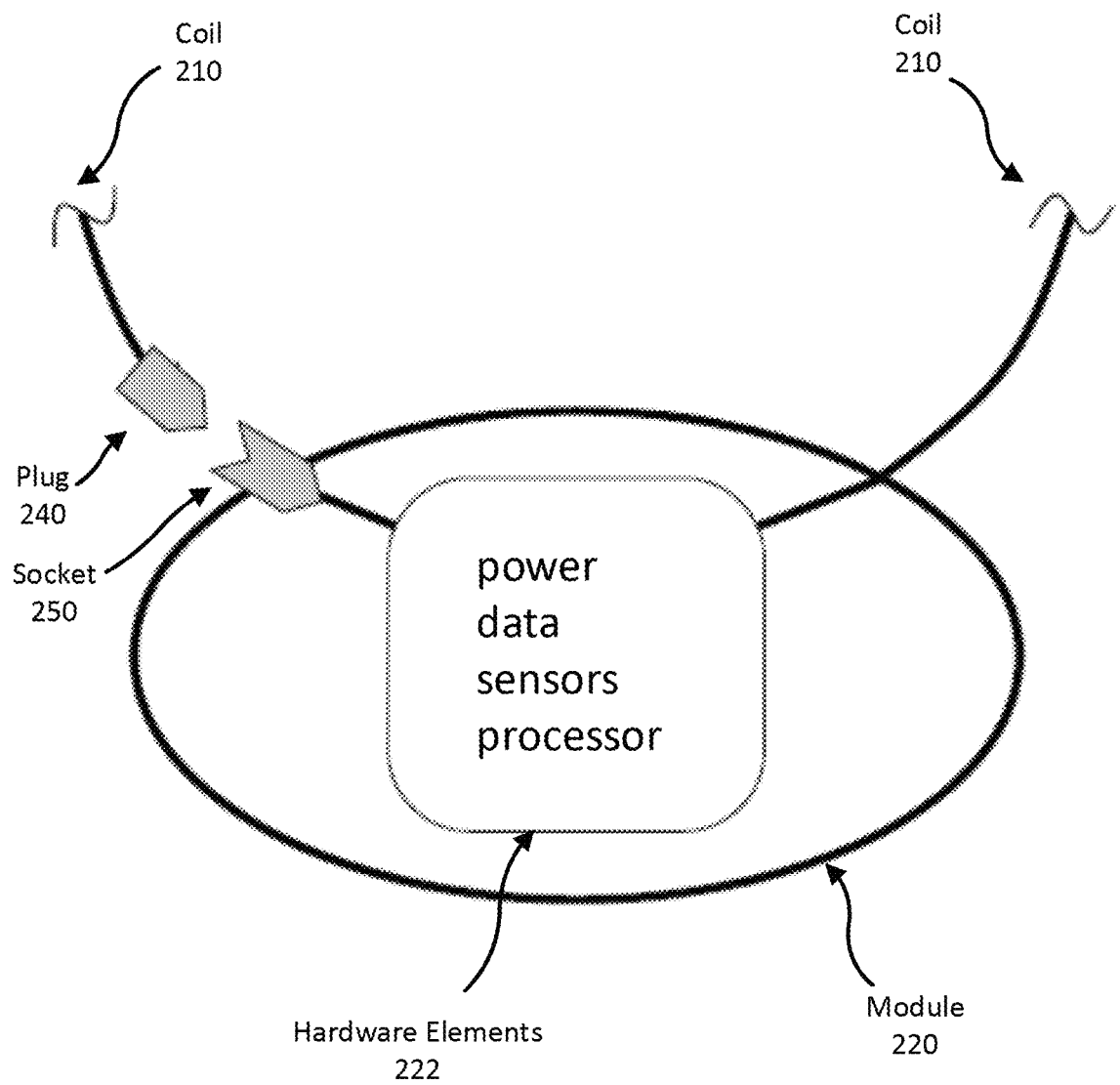
FIG. 2B shows a representation of the control electronics contained within the necklace of an augmented reality system.

FIG. 2B is another illustration of a source for an augmented reality system (e.g., such as necklace 110). In the illustrated embodiment, the necklace 110 includes a module 220 that may have an exterior appearance of jewelry or a fashion accessory. However, the module 220 may contain additional hardware elements 222 such as: a power source, a battery; a modulator to drive a radio-frequency current in the necklace coil; a data modem to encode data on the radio-frequency signal; sensors such as microphones, cameras, inertial sensors, GPS receivers, barometric pressure sensors, etc.; a cellular radio; a Wi-Fi radio; a Bluetooth radio; a graphics processing unit; and/or, a microprocessor and memory. In other configurations, the hardware elements 222 included in module 220 may be distributed about the circumference of the necklace.

When the hardware elements 222 produce a radio-frequency current (or any other alternating current) in the necklace coil 210, power may be inductively coupled into a coil embedded in a contact lens display 120. Each coil can be made to operate at a desired operating frequency with capacitive and/or inductive matching circuits. Data may also be transmitted to the contact lens display 120 by modulating the radio-frequency current in the necklace coil 210. Amplitude, frequency, and phase modulation are examples of modulation schemes that may be employed. For example in frequency shift keying, a pair of discrete frequencies are used to indicate logical "0" and logical "1".

The hardware elements 222 may include a microphone (or multiple microphones) to sense voices and other sounds. The wearer of an augmented reality system 100 may control the system by speaking to it, for example. The system 100 may also include hardware elements 222 such as a speaker and/or wireless connection to earphones. The system 100 may be controlled via a touch sensor in the necklace or via gestures detected by hardware elements 222 including radar (e.g. 60 GHz radar), ultrasonic and/or thermal sensors.

Additional hardware elements 222 such as inertial (acceleration and rotation rate) sensors, coupled with a barometric pressure sensor and a GPS receiver may provide position and velocity data to the AR system 100. Further, cellular radio and/or Wi-Fi radio hardware elements 222 can provide connections to voice and/or data networks. Finally, a processor, graphics processing unit and memory can run applications and store data. Broadly, the hardware elements 222 are configured to transmit data and images for display by a contact lens display 120 on a wearer's eyes.

When the AR system 100 is connected to an external electronic device, any of the sensors, processors and other components mentioned above may be located in the electronic device. Alternatively, the hardware elements 222 of the necklace 110 may connect to an electronic device wirelessly or it may connect physically via a plug-and-socket connector or another type of connector.

Figure 2C:
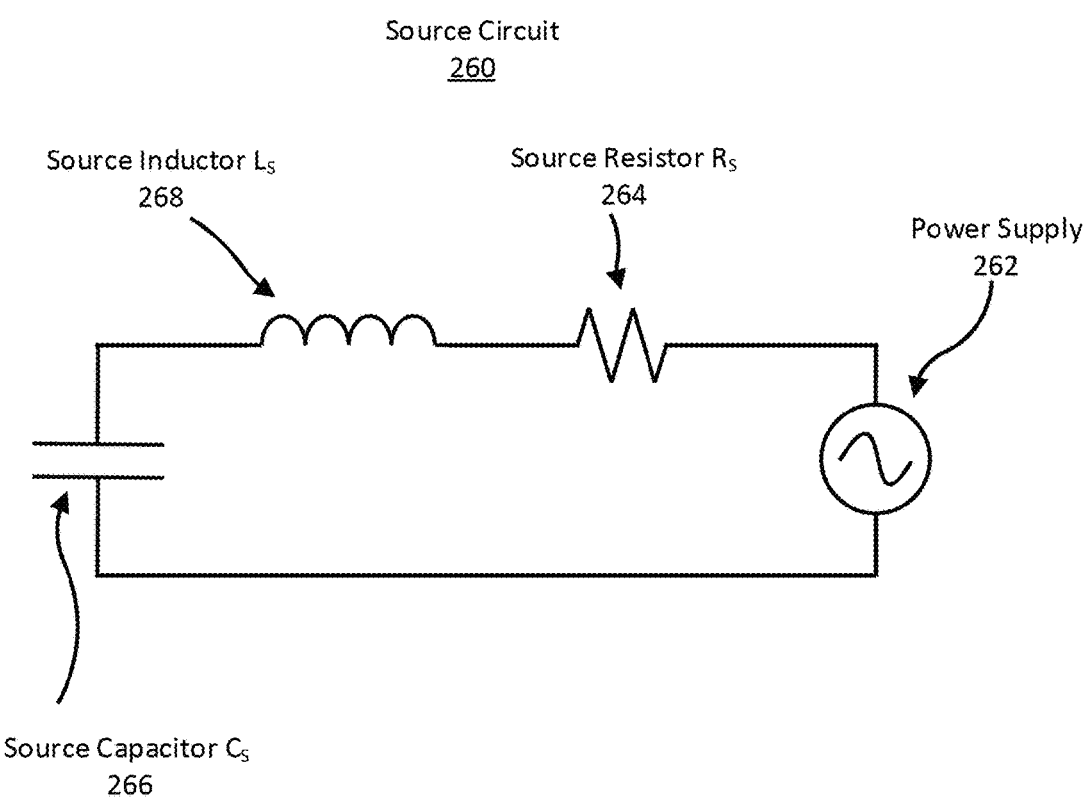
FIG. 2C shows an equivalent circuit diagram of a necklace of an augmented reality system.

FIG. 2C is a representative diagram of a source circuit 260 for generating the time-varying magnetic field of an AR system 100 (e.g., necklace 110). Generally, the source circuit 260 generates a time-varying magnetic field that varies at a source frequency $f_S$. In various other embodiments, the source circuit 260 can be a different configuration and include additional (or fewer) elements.

In one configuration, the source circuit 260 represents a resonant circuit included in necklace 110 that resonates at source frequency $f_s$. In the illustrated embodiment, the source circuit 260 is represented by a series RLC circuit, but can be represented by any other circuit that can resonate. Here, the source circuit 260 is for a source that forms one side of an inductive coupling system. The source circuit 260 contains a power supply 262 for generating a supply voltage $V_S$. Additionally, the source circuit 260 includes a source resistor $R_S$ 264, a source capacitor $C_S$ 266, and a source inductor $L_S$ 268 connected in series to the power supply 262.

The illustrated source circuit 260 is a representative circuit of a source (e.g., necklace 110). That is, any number hardware elements are represented by the source resistor $R_S$ 264, source capacitor $C_S$ 266, and source inductor $L_S$ 268. As an example the source resistor $R_S$ 264 can include resistive hardware elements 222, contact resistances, coil 210 resistance, and resistance interactions with the body of the wearer, etc.; the source capacitor $C_S$ 266 can include capacitive hardware elements 222; and, the source inductor $L_S$ 268 can include inductive hardware elements 222 (e.g., conductive coil 210) etc. The various included elements contribute to the values of $R_S$, $C_S$, and $L_S$, respectively.

In a configuration where the source circuit 260 is a resonant circuit, the energy in the source circuit 260 oscillates between electric energy stored in the source capacitor $C_S$ 266 and magnetic energy stored in the source inductor $L_S$ 268. The energy oscillation in the source circuit 260 has a frequency response which depends on the values of $R_S$, $C_S$, and $L_S$. The impedance of the source circuit 260 is minimized at its resonant frequency:

$$f_S = \frac{1}{2\pi\sqrt{L_S C_S}} \quad (1)$$

The various hardware elements 222 in the source are selected such that the source circuit 260 operates at approximately $f_S$ during operation of the AR system 100. In the example where the source circuit 260 is a resonant circuit, energy and data are more efficiently transferred to an inductively coupled resonant circuit (e.g., in the contact lens display 120) when both the source circuit 260 and the inductively coupled resonant circuit resonate at the same frequency. In various configurations, the source circuit 260 can be any other circuit that operates at a source frequency $f_S$. In some configurations, the source may not include a resonant circuit. Generally, the source circuit 260 maintains a frequency response at a substantially similar frequency (i.e., within a 10% variance of $f_S$).

Figure 3A:
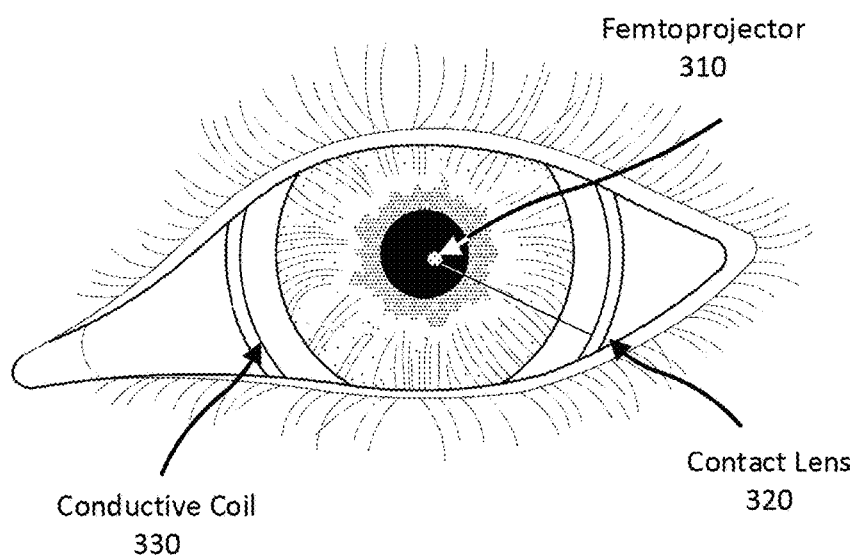
FIG. 3A shows a plan view of a contact lens display mounted on a person's eye.

FIG. 3A shows a contact lens display 120 mounted on a person's eye. The contact lens display 120 includes a femtoprojector 310 mounted in a contact lens 320, and a conductive coil 330 near the edge of the contact lens 320 for receiving power and data wirelessly from the necklace 110 as in FIGS. 2A-2C. The conductive coil 330 is part of a resonant circuit, and so the conductive coil 330 may also be referred to as a contact lens resonant coil. The contact lens 320 may include electronics (not shown) for recovering power from the conductive coil 330 in the contact lens 320, processing data transmitted to the contact lens 320, and driving a light emitting element inside the femtoprojector 310. The femtoprojector 310 produces images on a wearer's retina.

Figure 3B:
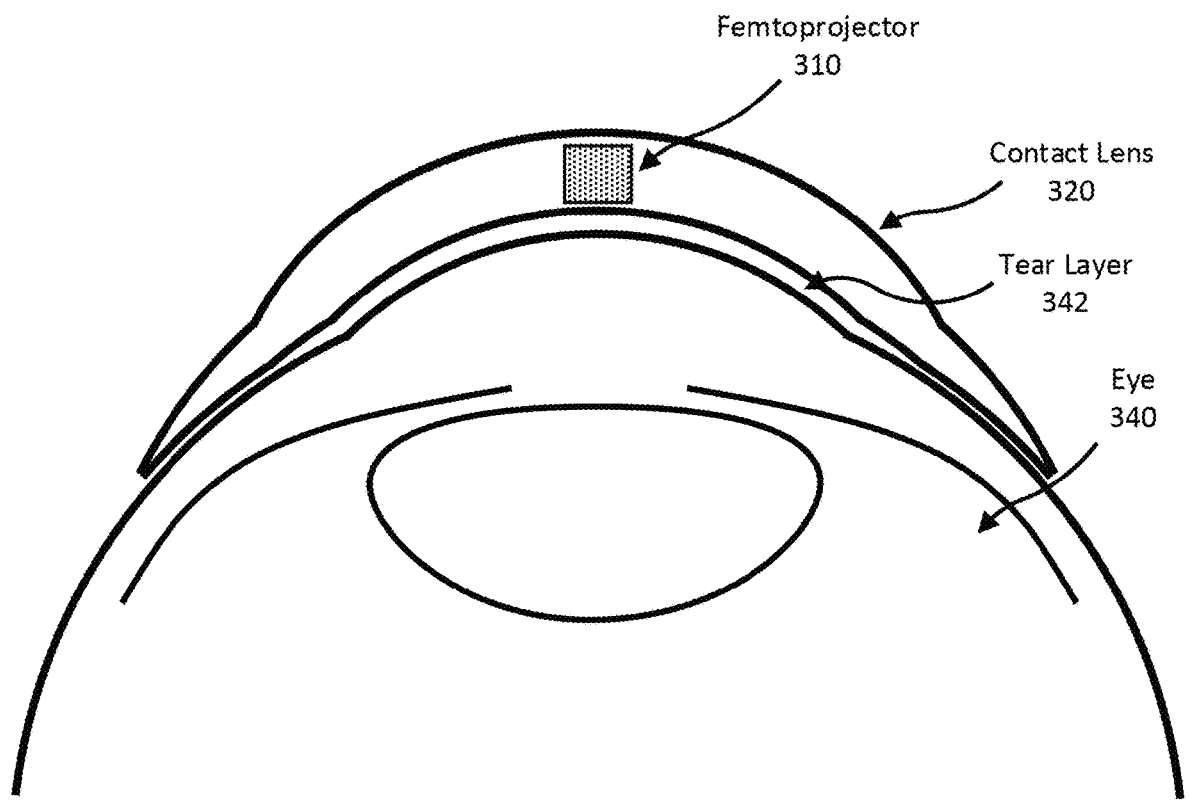
FIG. 3B shows a cross-sectional view of a contact lens display mounted on a person's eye.

FIG. 3B shows a cross-sectional view of a contact lens display 120 containing a femtoprojector 310 in a contact lens 320. FIG. 3B shows an embodiment using a scleral contact lens but the contact lens does not have to be scleral (i.e., it could be a soft contact lens). The contact lens 320 is separated from the cornea of the user's eye 340 by a tear layer 342. The contact lens display 120 has an outer surface facing away from the eye 340 and an inner surface contacting the tear layer 342. Generally, the femtoprojector 310 is positioned between the front surface and the back surface. The contact lens 320 preferably has a thickness that is less than 2 mm, and the femtoprojector 310 preferably fits in a 2 mm by 2 mm by 2 mm volume. The contact lens 320 is comfortable to wear and maintains eye health by permitting oxygen to reach the user's eye 340.

Figure 3C:
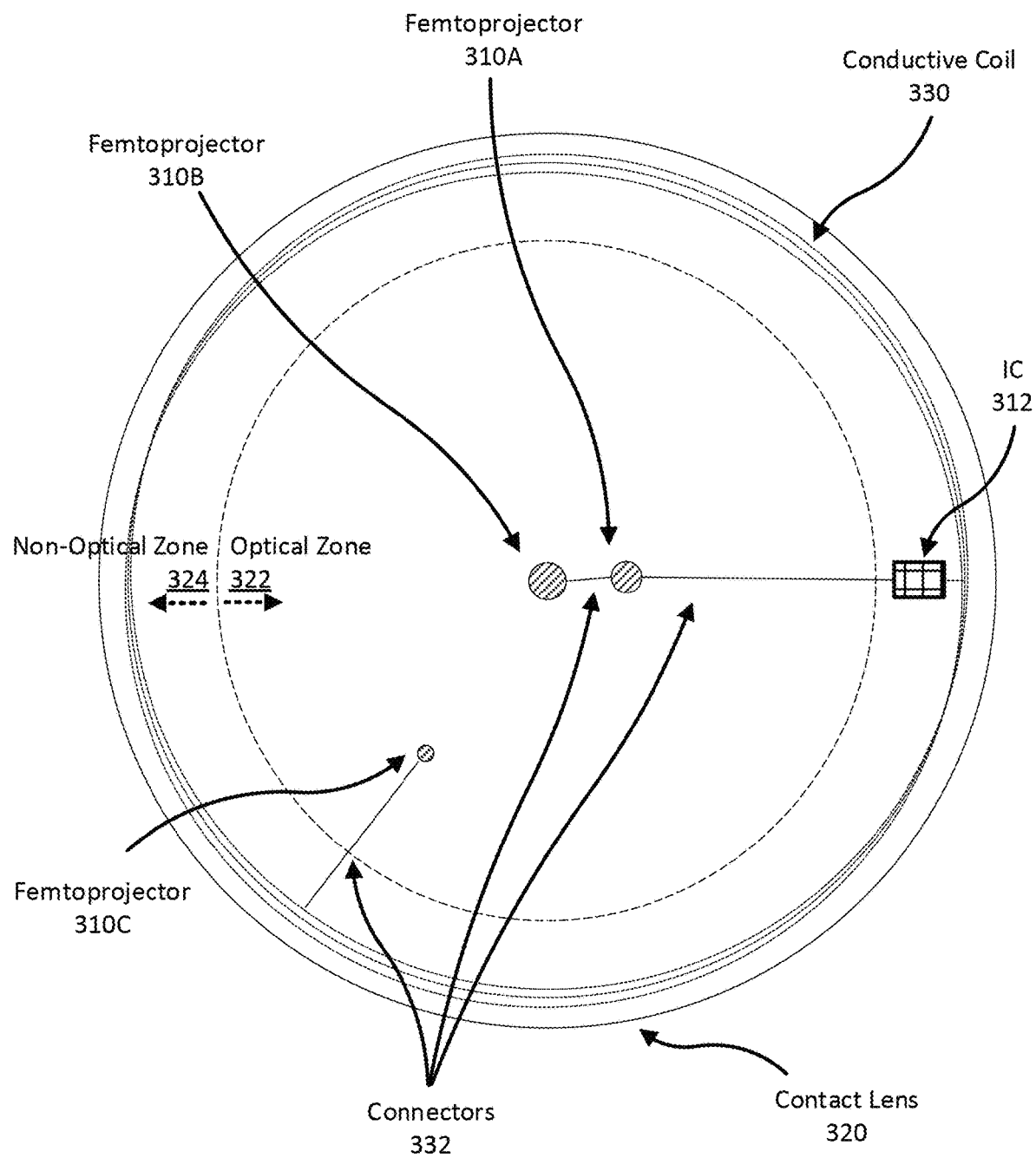
FIG. 3C shows a plan view of the contact lens display of FIG. 3A in more detail.

FIG. 3C shows the contact lens display 120 of FIGS. 3A-3B in more detail. FIG. 3C shows a top view of a contact lens display 120 with multiple femtoprojectors 310A-310C in a contact lens 320. The conductive coil 330 in the contact lens 320 may have between about 1 and about 200 turns arranged in a spiral and which extend along a peripheral region of the contact lens display 120. In other configurations, the conductive coil 330 can be arranged in a cylindrical coil or any other looped shape. The conductive coil 330 is connected to the femtoprojectors 310 and other electronics via embedded connectors 332. The femtoprojector 310 is located in a central region of the contact lens display 120 which is surrounded by the conductive coil 330. The femtoprojector 310, conductive coil 330, and electronics are enclosed in lens material such that the lens feels to a wearer like a conventional contact lens. The contact lens 320 is between about 6 mm and about 25 mm in diameter and preferably between about 8 mm and about 16 mm in diameter.

The ratio of the contact lens 320 diameter to femtoprojector 310 lateral size is roughly 25:1 for the largest femtoprojector. This ratio is normally between about 15:1 and 30:1, but may be as small as 5:1 or as large as 50:1. FIG. 3C shows three femtoprojectors 310A-C in the contact lens 320, but many femtoprojectors, or only one, may be mounted in such a contact lens 320. Eye-mounted displays with as many as 49 femtoprojectors in a contact lens 320 have been proposed. If there is only one femtoprojector 310 in a contact lens 320, it need not be in the center of the lens.

The femtoprojectors 310 in FIG. 3C are also shown as different sizes. The entire display, made up of all the femtoprojectors 310, may be a variable resolution display that generates the resolution that each region of the eye can actually see, vastly reducing the total number of individual "display pixels" required compared to displays of equal resolution and field of view that are not eye-mounted. For example, a 400,000 pixel eye-mounted display using variable resolution can cover the same field of view as a fixed external display containing tens of millions of discrete pixels.

In FIG. 3C, the contact lens 320 is roughly divided by the dashed circle into an optical zone 322 and a non-optical zone 324. Components in the optical zone 322 may be in the optical path of the eye 340, depending on how far open the iris is. Components in the non-optical zone 324 fall outside the aperture of the eye 340. Accordingly, active optical elements are generally positioned in the optical zone 322 and non-active optical elements are positioned in the non-optical zone 324. For example, femtoprojectors 310 are within the optical zone 322 while the conductive coil 330 is in the non-optical zone 324. Additionally, the contact lens 320 may also contain other components positioned in the non-optical zone 322 for data processing, data transmission, and power recovery and/or positioning. As an example, an integrated circuit (IC) 312 is positioned in the non-optical zone 324 and is connected to the femtoprojectors 310.

More generally, the contact lens display 120 includes a resonant circuit that receives energy from a source via inductive coupling. The resonant circuit can include the conductive coil 330 and a capacitive circuit in the IC 312. The conductive coil 330 receives a magnetic field and converts the magnetic field into electrical energy. The conductive coil 330 and the capacitive circuit together form a LC tank that resonates at a resonant frequency. The capacitance can be controlled to change the capacitance of the resonant circuit, thereby tuning the resonant frequency of the resonant circuit to increase the efficiency of the inductive coupling and/or maximize the voltage across the capacitive circuit.

The contact lens display 120 can also include other components such as antennae or optical/infrared photodetectors, data storage and buffering, controls, and possibly also on-lens processing components. The contact lens display can include positioning components such as accelerometers and fiducial or other structures used for eye tracking and head tracking. The contact lens display 120 can also include data processing components can include a microprocessor or other data processing elements.

There are many ways in which the functions of receiving power and data and displaying the data onto the eye of a wearer can be configured with an eye-mounted display(s) to create embodiments of eye-mounted display systems. Portions of these subsystems may be external to the user, while other portions may be worn by the user in the form of a headpiece or glasses. Components may also be worn on a belt, armband, wrist piece, necklace or other types of packs. Some components may be included in external devices such as a watch, a cell-phone, a laptop, etc.

Figure 3D:
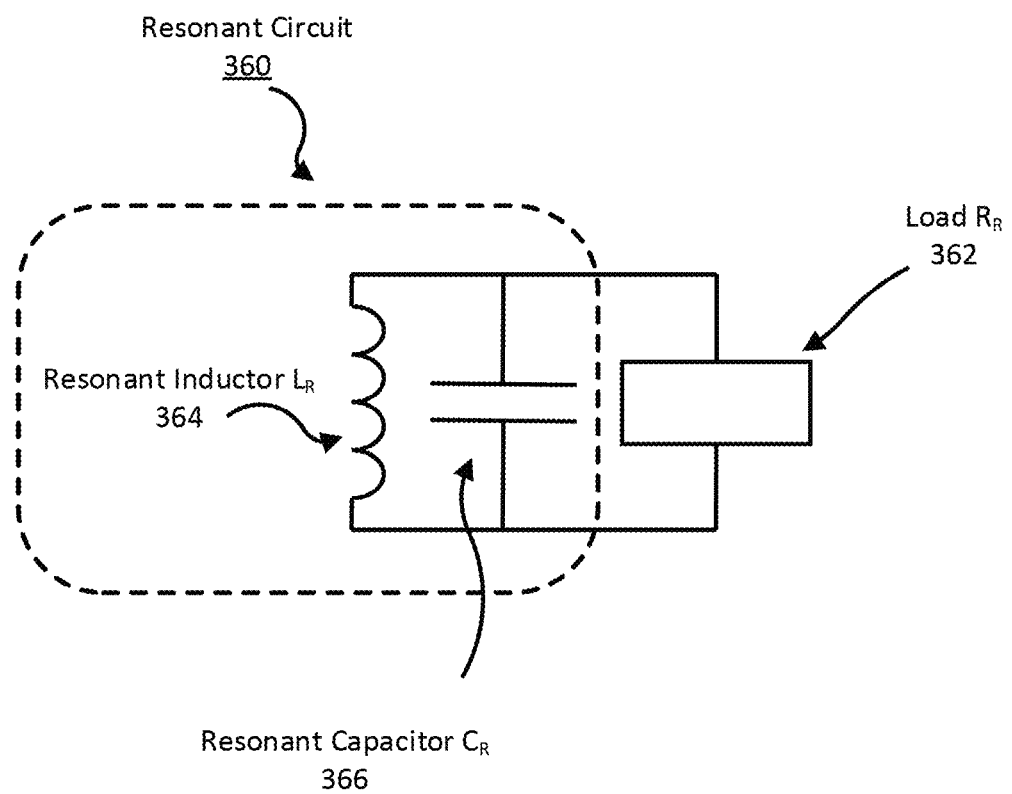
FIG. 3D shows a representative circuit diagram of at least a portion of the contact lens display of an augmented reality system.

FIG. 3D is a representative circuit diagram of at least a portion of the contact lens display 120 of the AR system 100. The contact lens display 120 can be modeled as a parallel RLC circuit. The resonant inductor $L_R$ 364 and resonant capacitor $C_R$ 366 are connected in parallel and form a resonant circuit 360 that resonates at a resonant frequency. The resonant circuit 360 is configured to inductively couple to a source (e.g., source circuit 260 in necklace 110) at a resonant frequency. In other configurations, the resonant circuit 360 can include any number of additional (or fewer) elements. Generally, the resonant circuit 360 resonates at a resonant frequency $f_R$ and is tunable such that the resonant circuit 360 resonates at the frequency $f_S$ emitted by the source (i.e., $f_R=f_S$). A load $R_R$ 362 is connected in parallel to the resonant circuit 360.

In one example embodiment of the resonant circuit 360, resonant inductor $L_R$ 364 includes conductive coil 330, and resonant capacitor $C_R$ 366 includes a capacitor network. The capacitance of the capacitor network can be periodically adjusted such that resonant circuit 360 is made to resonate at or near the source frequency $f_S$. Load $R_R$ 362 includes other elements of the contact lens 320 (e.g., a power harvesting circuit, a femtoprojector, etc.).

In other example embodiments, the illustrated resonant circuit 360 is a representative circuit. That is, any number hardware elements of the contact lens 320 are represented by the resonant circuit 360. The hardware elements of the resonant circuit 360 may not be configured as a single circuit and can include hardware elements from anywhere within the contact lens 320. As an example the load $R_R$ 362 can include femtoprojectors 310, elements of the IC 312, an energy recovery circuit, etc.; the resonant capacitor $C_R$ 366 can include the capacitive circuit, other capacitive elements of the IC 312, capacitive elements of the femtoprojector 310, etc.; and the resonant inductor $L_R$ 364 can include the conductive coil 330, other inductive elements of the IC 312, etc. The various included elements contribute to the values of $R_R$, $C_R$, and $L_R$, respectively.

Energy in the resonant circuit 360 oscillates between electric energy stored in the resonant capacitor $C_R$ 366 and magnetic energy stored in the resonant inductor $L_R$ 364. The energy oscillation in the resonant circuit 360 has a frequency response which depends on the values of $R_R$, $C_R$, and $L_R$. The impedance of the resonant circuit 360 is maximized at its resonant frequency:

$$f_R = \frac{1}{2\pi\sqrt{L_R C_R}} \qquad (2)$$

Selection of the hardware elements in the resonant circuit 360 tunes the frequency response of the resonant circuit 360 such that it resonates at $f_R$. When the resonant circuit 360 resonates at a frequency similar to the source frequency $f_S$ (i.e., $f_S=f_R$), energy is more efficiently received from the inductively coupled source circuit 260 (e.g., the necklace 110).

The illustrated resonant circuit 360 does not account for changes to the operating environment of the contact lens 320 (i.e. the human eye 340). In a normal operating environment, as the wearer of the contact lens 320 blinks, a parasitic capacitance changes the electrical characteristics of the resonant circuit 360. In particular, the introduced parasitic capacitance changes the resonant capacitance $C_R$ 366 of resonant circuit 360 and changes the frequency response of the circuit (e.g., changes the resonant frequency $f_R$ to $f_A$). Generally, the parasitic capacitance is dependent on the area of the contact lens 320 that is in contact with eyelid 346. Thus, as the eye 340 blinks, the frequency response of the resonant circuit 360 continuously changes resulting in fluctuations in the power transmission efficiency. In other operating environments, temperature, tears, or a rotating eyeball can also induce parasitic capacitances.

Figure 4A:
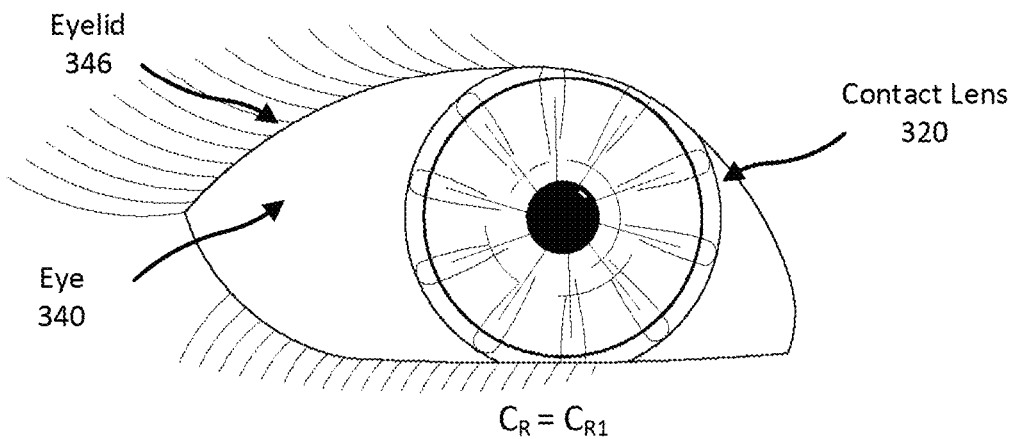
FIG. 4A-4C shows the process of a human eye blinking while wearing a contact lens display of an augmented reality system.
Figure 4B:
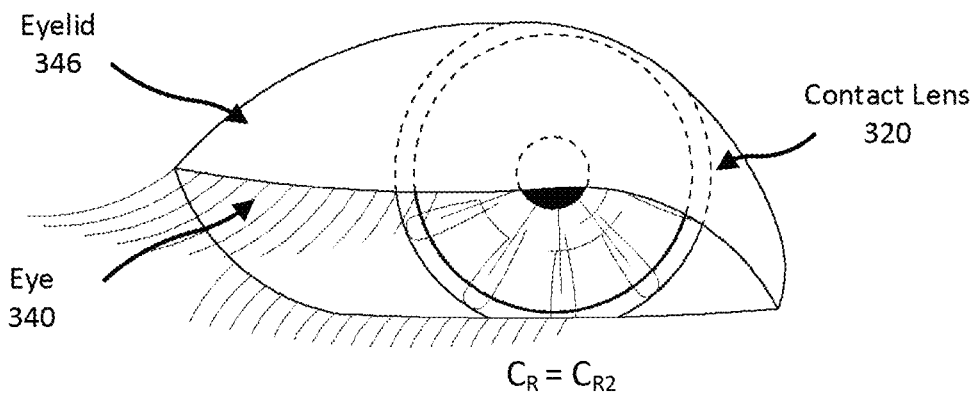
Figure 4C:
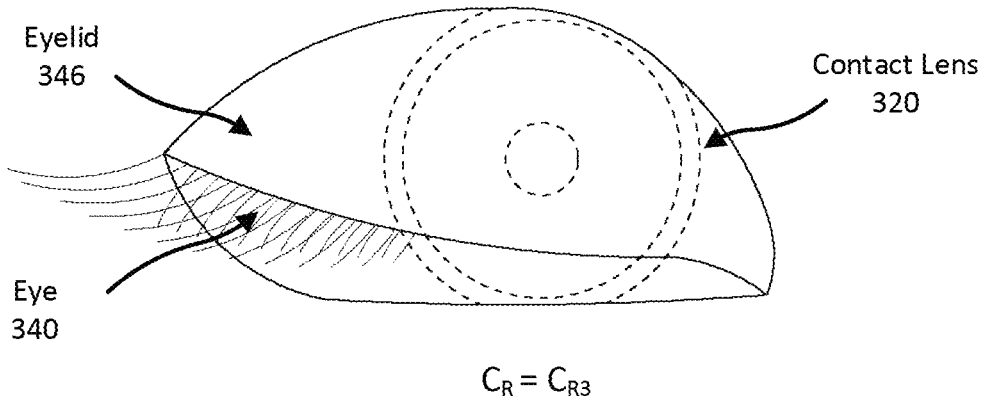

FIGS. 4A-4C are illustrations of a blinking human eye 340 wearing a contact lens 320 including a resonant circuit 360. To begin, in FIG. 4A the human eye 340 is fully open and very little human skin (i.e. an eyelid 346) is in contact with the contact lens 320 (and, thereby, conductive coil 330). Accordingly, there is negligible parasitic capacitance between the contact lens 320 and the eyelid 346, and the resonant capacitance $C_R$ 366 of the resonant circuit 360 is $C_{R1}$. In this example, the resonant circuit 360 resonates at frequency $f_R$ when the resonant capacitance $C_R$ 366 is $C_{R1}$. In FIG. 4B the eye 340 begins to blink and the eyelid 346 slides down the contact lens 320 placing additional skin in contact with the contact lens 320. Thus, the parasitic capacitance between the skin and the contact lens 320 increases and the resonant capacitance $C_R$ 366 of the circuit becomes $C_{R2}$. Changing the resonant capacitance $C_R$ 366 from $C_{R1}$ to $C_{R2}$ changes the frequency response of the resonant circuit 360 and the circuit no longer resonates at frequency $f_R$. In FIG. 4C the eyelid 346 is nearly shut and even more skin is in contact with the contact lens 320. Consequently, the parasitic capacitance between the skin and the contact lens 320 further increases and the resonant capacitance $C_R$ 366 of the circuit becomes $C_{R3}$. The resonant capacitance $C_{R3}$ changes the frequency response of the resonant circuit 360 and the resonant circuit 360 still does not resonate at frequency $f_R$. The illustrated examples of FIGS. 4A-4C show three values of resonant capacitance $C_R$366 as the eye blinks, but there may be any number of resonant capacitances $C_R$ 366 based on the amount of human skin in contact with the contact lens 320 at any given time. More generally, there can be any number of resonant capacitances $C_R$ 366 based on any other change to the operating environment of the AR system that changes the parasitic capacitance of the resonant circuit 360.

As previously described, when both the resonant circuit 360 and source circuit 260 are inductively coupled, energy and data are transferred from the source circuit 260 to the resonant circuit 360. In some configurations, when the resonant circuit 360 resonates at the same frequency of the source circuit 260 (i.e., $f_S=f_R$), the resultant current through resonant circuit 360 can be in phase with the supply voltage of the source circuit 260 and energy transfer between the two circuits is more efficient. However, as the eye 340 blinks, parasitic capacitance results in a fluctuation in the resonant capacitance $C_R$ 366 of the circuit. Thus, the frequency response of the resonant circuit 360 varies and the resonant circuit 360 is not always resonating at $f_R$ leading to a decrease in power transfer efficiency (i.e., $f_R \neq f_S$).

Figure 4D:
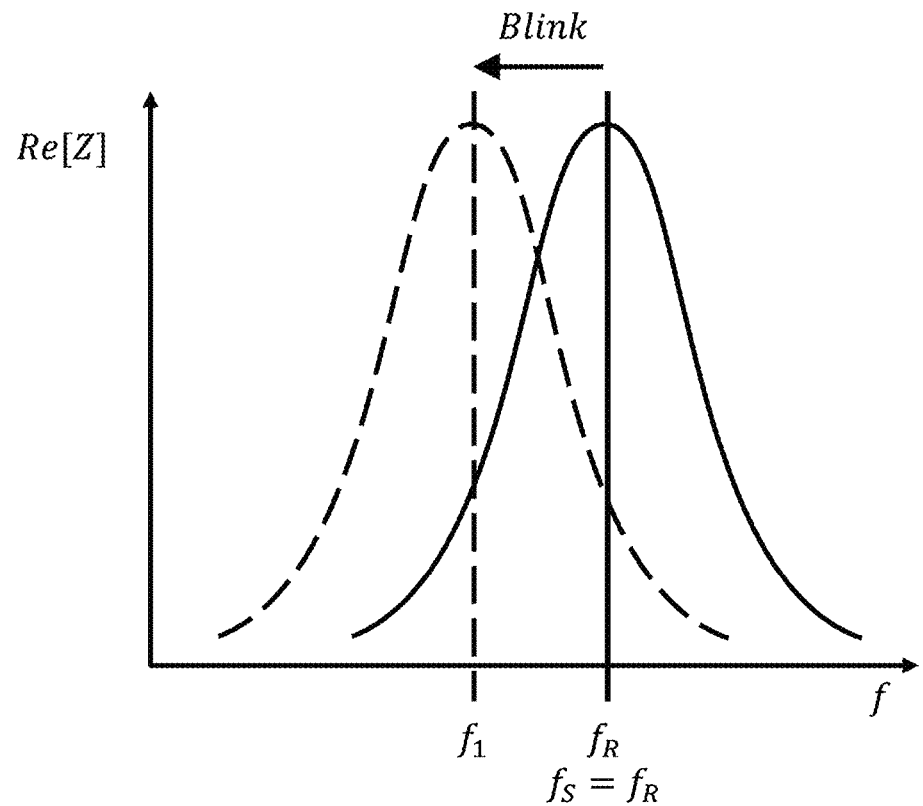
FIG. 4D illustrates a comparison of the frequency response of a resonant circuit for an open eye and a closed eye.

As an example, FIG. 4D illustrates a comparison of the frequency response of the resonant circuit 360 for an open eye 340 (as in FIG. 4A) and a closed eye 340 (as in FIG. 4C). When the eye 340 is open, the resonant circuit 360 resonates at approximately $f_R$. When the eye 340 is closed there is a parasitic capacitance that changes the resonant capacitance $C_R$ 366 and causes the resonant circuit 360 to resonate at $f_1$(i.e., $f_1 \neq f_R$). Power transmission efficiency is highest when the resonant circuit 360 resonates at the same frequency as source circuit 260 (i.e., $f_R=f_S$). In one embodiment, recovering energy at the contact lens display 120 can involve an energy recovery circuit. In this embodiment, the IC 312 of the contact lens 320 can include an energy recovery circuit configured to recover energy from the resonant circuit 360 and power various components of the contact lens display 120 (e.g., femtoprojector 310). An example of the energy recovery circuit can be a power converter.

In at least one embodiment of the disclosure, circuits within the contact lens 320 act to minimize the effects of the fluctuations in parasitic capacitance and resonant frequency caused by changes to the environment. The contact lens 320 includes circuits that periodically adjust the resonant capacitance $C_R$ 366 such that the resonant frequency $f_R$ is substantially similar to the source frequency $f_S$ for a target period of time (e.g., less than 10% difference between $f_C$ and $f_S$ for 90% of the operating time of the AR system 100). As an example, the contact lens can have a capacitive circuit with an adjustable capacitance. The adjustable capacitance can be changed to compensate for capacitance fluctuations induced by blinking (or other environment changes). The capacitive circuit is controlled by a feedback circuit which measures the voltage across the capacitive circuit using a voltage sensing circuit. The voltage sensing circuit sends the measured voltage to a control unit which changes the capacitance of the capacitive circuit based on the measured voltage. Changing the capacitance of the capacitance circuit modifies the resonant capacitance $C_R$ 366 of resonant circuit 360. Generally, the control unit changes the capacitance of the capacitance circuit by capacitance increments until the voltage across the capacitance circuit decreases. Once the voltage across the capacitance circuit decreases, the control unit changes the capacitance of the capacitance circuit by a capacitance increment in the opposite direction. The control unit periodically changes the capacitance of the capacitive circuit by a capacitive increment such that the resonant circuit 360 resonates at the same frequency $f_R$ as the source circuit $f_S$. Sensing voltages and applying capacitance changes is described in more detail in regards to FIGS. 6A-6B.

The control unit can adjust the capacitance of the capacitive circuit in a variety of manners. In one configuration, the capacitive circuit includes a switched capacitor network having any number of parallel branches, with each branch including a corresponding switch in series with a corresponding capacitor. The control unit modifies the capacitance of the capacitive circuit by changing the state of the switch (e.g. open or closed). Each capacitor of the switched capacitor network can have the same value or a different value. Further, any number of switches can be operated simultaneously such that any number of capacitors of the capacitive circuit can function in parallel. Thus, the switched capacitor network can have a large number of possible capacitance values. However, in practice, the switched capacitor network has a range of quantized capacitance values based on the number of branches and size of capacitors in the switched capacitor network. In another example configuration, the capacitive circuit includes a variable capacitor and the control unit modifies the capacitance of the capacitive circuit by changing the capacitance of the variable capacitor. In this case, the capacitance network has a range of capacitance values based on the configuration of the variable capacitor.

Figure 5A:
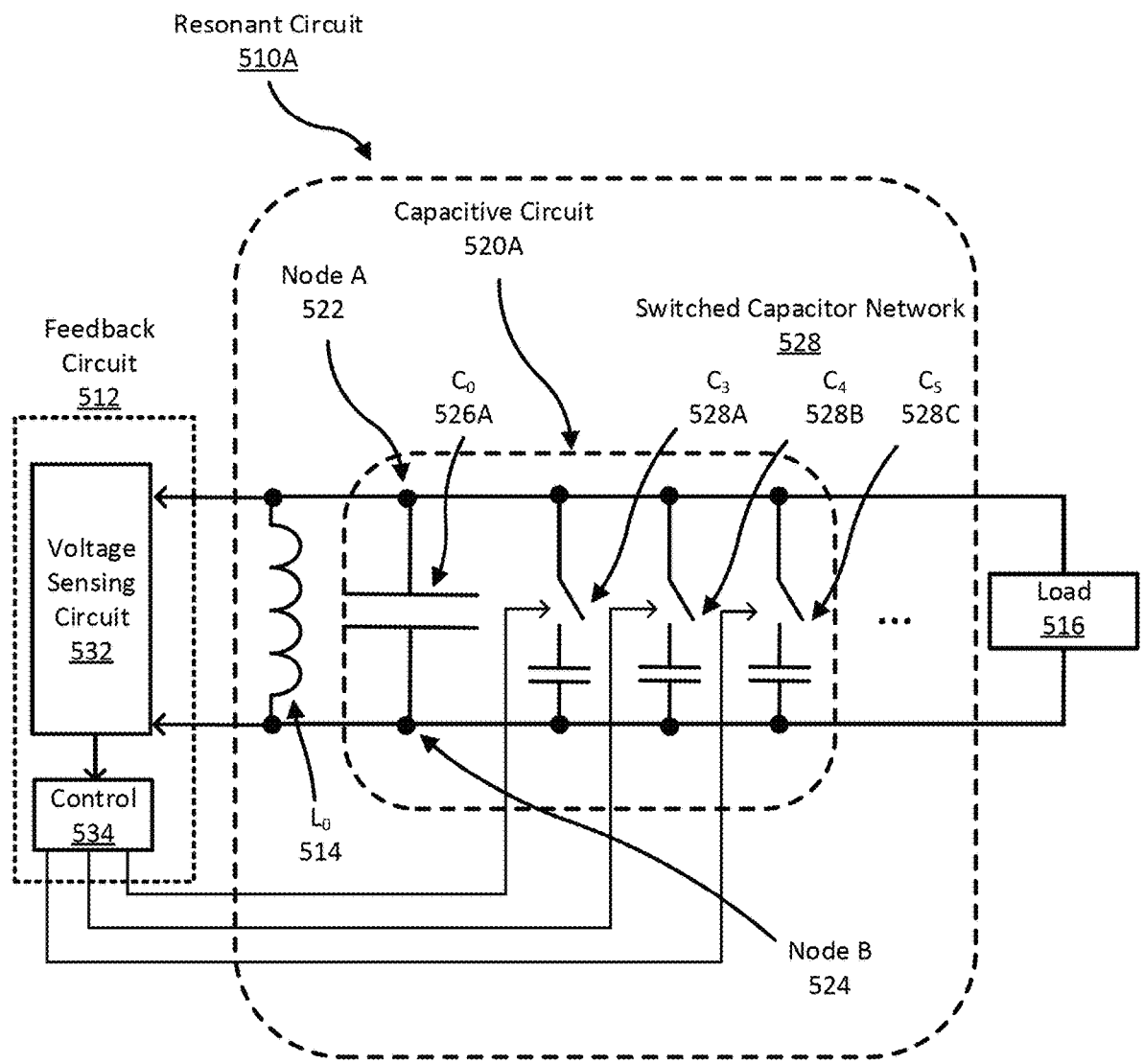
FIG. 5A-5C show circuit diagrams of a contact lens with a resonant circuit that can be tuned such that it resonates at a resonant frequency $f_R$ similar to source frequency $f_S$.

FIG. 5A shows a circuit diagram of a contact lens with a resonant circuit that can be tuned such that it resonates at a resonant frequency $f_R$ similar to source frequency $f_S$, according to one example embodiment. In this example, the contact lens includes a resonant circuit 510A, feedback circuit 512, and load 516. The resonant circuit 510A includes an inductor $L_0$514, and a capacitive circuit 520A connected in parallel. Resonant circuit 510A is similar to resonant circuit 360. However, in resonant circuit 510A, resonant inductor $L_R$ 364 is replaced by inductor $L_0$ 514, resonant capacitor $C_R$ 366 is replaced by capacitive circuit 520A, and additional sensing and control circuits are illustrated. The load 516 can include an energy recovery circuit and a femtoprojector. The energy recovery circuit converts alternating current (AC) electrical energy from the resonant circuit 510A into direct current (DC) electrical energy. The output of the energy recovery circuit can be a DC supply voltage that is used to provide power to the femtoprojector.

Generally speaking, the capacitive circuit 520A may be a capacitor network that includes several different capacitors in various configurations. The resonant circuit 510A includes Node A 522 and Node B 524 illustrated for reference. Moreover, the capacitive circuit 520A includes a first capacitor $C_0$ 526A connected between Node A 522 and Node B 524. The capacitive circuit 520A also includes a switched capacitor network 528 having a number of branches with each branch including a parallel switched capacitor C3, C4, C5, etc. (e.g., 528A, 528B, 528C) connected between Node A 522 and Node B 524. At least a subset of the branches of the switched capacitor network 528 can follow a binary coded decimal (BCD) pattern. When the branches of the switched capacitor network 528 follow a BCD pattern, the capacitors of the branches can have sequentially increasing capacitance values such that the next capacitor in the sequence has a capacitance value that is double that of the current capacitor in the sequence. That is the capacitors of the branches may have values of 1 $C_i$, 2 $C_i$, 4 $C_i$, 8 $C_i$, 16 $C_i$, etc., where C1 is a capacitance value such as, for example, 1 pF.

In this example, the resonant circuit 510A resonates at a frequency similar to a source (e.g., source circuit 260 of necklace 110) when the human eye 340 is open and there is no (or negligible) parasitic capacitance between the resonant circuit 510A and the eyelid 346 (i.e., $f_S=f_R$). When the eye 340 begins to blink and the eyelid 346 moves across the contact lens the parasitic capacitance increases (i.e., as in FIGS. 4A-4C). Thus, the frequency response of the resonant circuit 510A changes and the resonant circuit 510A no longer resonates at a frequency similar to the source (i.e., $f_1 \neq f_S$) and the energy transfer efficiency decreases. In response, a voltage sensing circuit 532 measures the voltage change across Node A 522 and Node B 524 induced by the parasitic capacitance fluctuations and sends the measured voltage to the control unit 534.

In one configuration, the voltage sensing circuit 532 may charge a comparison capacitor (not shown) to the measured voltage across Node A 522 and Node B 524 such that the comparison capacitor stores a voltage that represents a previous level of the voltage across Node A and Node B. Thus, in some cases, the voltage sensing circuit 532 can compare the current voltage across Node A and Node B to a previous voltage across Node A and Node B using a comparator circuit. The voltage sensing circuit can send the present voltage across Node A and Node B, a previous voltage across Node A and Node B, or a voltage difference between Node A and Node B to the control unit.

The control unit 534 adjusts a capacitance of the capacitive circuit 520A (i.e., a capacitance adjustment) based on the voltage measured by the voltage sensing circuit 532. Generally, the capacitance adjustment compensates, at least somewhat, for the parasitic capacitance induced by a blinking eye such that the resonant circuit 510A resonates at the same frequency $f_R$ as the source frequency $f_S$. The control unit 534 applies the capacitance adjustment by controlling the state of switches in the switched capacitor network 528 (e.g., changing a switch from open to closed, or vice versa). The change in capacitance of capacitance circuit 520A tunes the resonant frequency of circuit 510A closer to the source frequency. In some cases, the change in capacitance of the resonant circuit 510A increases energy transfer efficiency of the AR system 100. Further, the change in capacitance of the resonant circuit 510A may increase the voltage across Node A 522 and Node B 524. As the eyelid moves across the contact lens, the control circuit 534 periodically adjusts the capacitance by changing the state of various switches in the switched capacitor network 528. Adjustments to the capacitive network 528 change the resonant frequency of the resonant circuit 510A such that the resonant frequency is substantially similar to the source frequency.

Figure 5B:
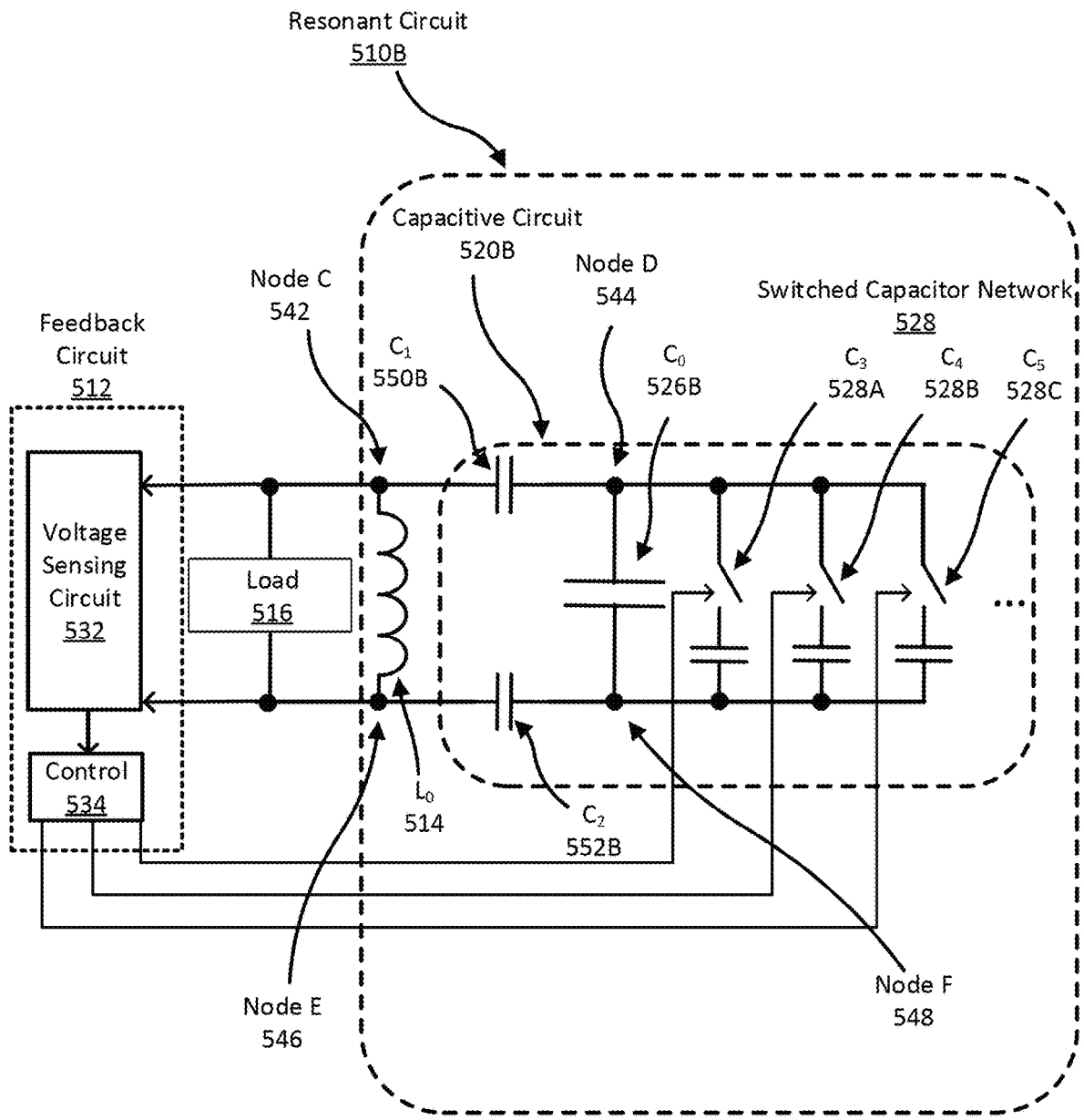

FIG. 5B shows a circuit diagram of a contact lens with a resonant circuit that can be tuned such that it resonates at a resonant frequency $f_R$ similar to source frequency $f_S$, according to a second example embodiment. In this example, the contact lens includes a feedback circuit 512, a load 516 and a resonant circuit 510B connected in parallel. Resonant circuit 510B is similar to resonant circuit 360. However, in resonant circuit 510B, resonant inductor $L_R$ 364 is replaced by inductor $L_0$ 514, resonant capacitor $C_R$ 366 is replaced by capacitive circuit 520B, and additional sensing and control circuits are illustrated.

The resonant circuit 510B includes Node C 542, Node D 544, Node E 546, and Node F 548 illustrated for reference. The capacitive circuit 520B now includes an additional first capacitor $C_1$ 550B connected between Node C 542 and Node D 544 and a second capacitor $C_2$ 552B connected between Node E 546 and Node F 548. The first capacitor $C_1$ 550B and the second capacitor $C_2$ 552B function to reduce the voltage drop across the switched capacitor network 528. The capacitive circuit 520B additionally includes a third capacitor $C_0$ 526B connected between Node D 544 and Node F 548. Finally, the capacitive circuit includes a switched capacitor network 528 having a number of branches including parallel switched capacitors $C_3$, $C_4$, $C_5$, etc. (e.g., 528A, 528B, and 528C) between Node D 544 and Node F 548.

In this example, the resonant circuit 510B is designed to resonate at a frequency similar to the source (e.g., source circuit 260 of necklace 110) when the human eye is open (i.e., $f_R=f_S$). The frequency response of the resonant circuit 510B changes when the eye blinks and the induced parasitic capacitance fluctuates (i.e., $f_R \neq f_S$). In this configuration, the voltage sensing circuit 532 measures the voltage across Node C 542 and Node E 546 as the parasitic capacitance changes and sends the measured voltage to the control unit 534. Here, the voltage sensing circuit 532 measures and sends voltages similarly to voltage sensing circuit of FIG. 5A. The control unit 534 adjusts the capacitance of capacitance circuit 520B by a capacitive increment by changing the state of switches in the switched capacitor network 528. The resulting change in capacitance acts to change the resonant frequency of the resonant circuit 510B such that it resonates at a frequency $f_R$ similar to the source frequency $f_S$ (i.e., $R=f_S$). In this configuration, the first capacitor $C_1$550B and the second capacitor $C_2$ 552B prevent voltage drops across the capacitive circuit 520 that may damage its constituent electronics and degrade performance of the resonant circuit 510B.

Figure 5C:
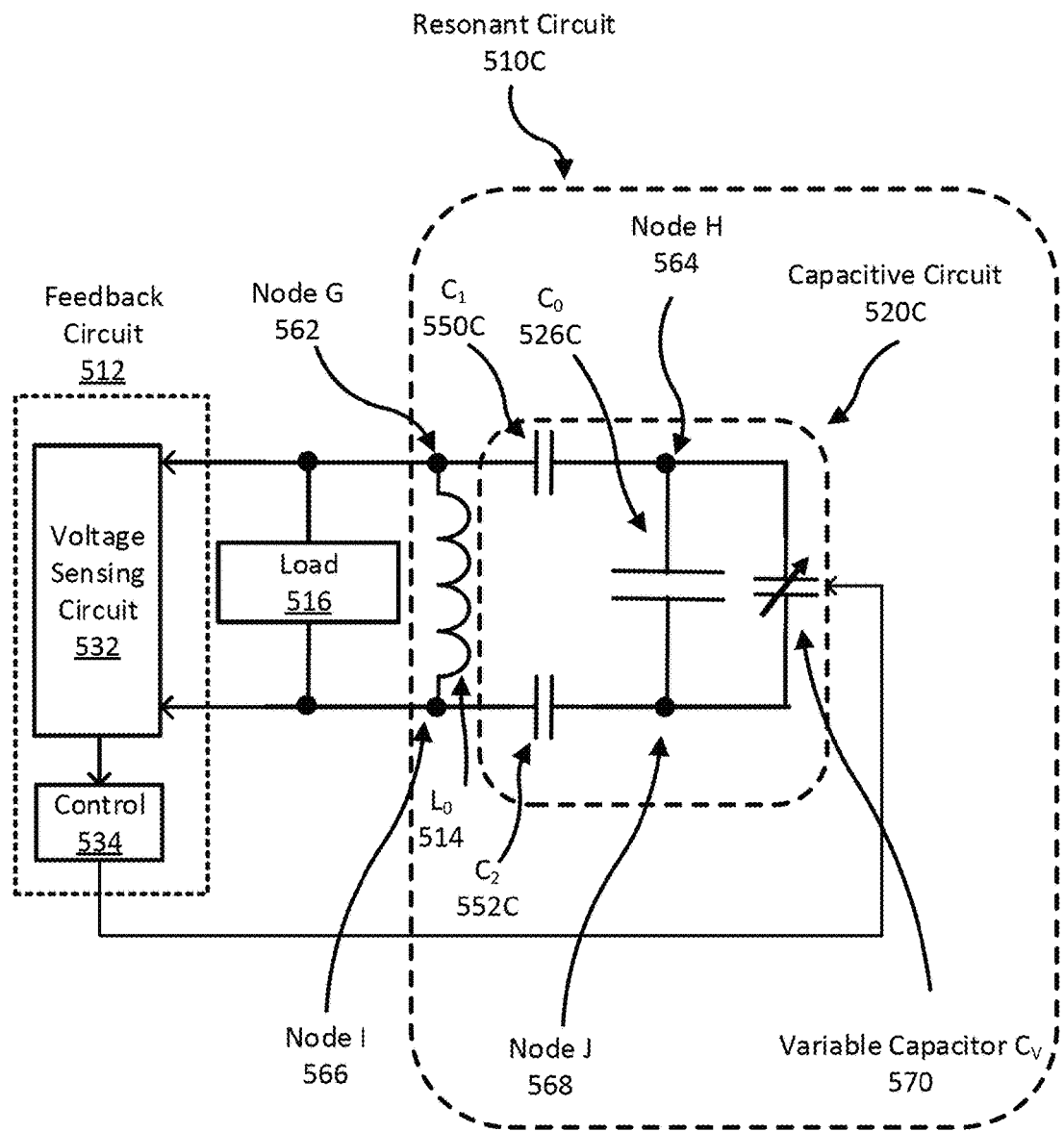

FIG. 5C shows a circuit diagram of a contact lens with a resonant circuit that can be tuned such that it resonates at a resonant frequency $f_R$ similar to source frequency $f_S$, according to a third example embodiment. In this example, the contact lens includes a feedback circuit 512, a load 516 and a resonant circuit 510C connected in parallel. Resonant circuit 510C is similar to resonant circuit 360. However, in resonant circuit 510C, resonant inductor $L_R$ 364 is replaced by inductor $L_0$ 514, resonant capacitor $C_R$ 366 is replaced by capacitive circuit 520C, and additional sensing and control circuits are illustrated.

The capacitive circuit 520C includes Node G 562, Node H 564, Node I 566, and Node J 568 illustrated for reference. The capacitive circuit 520C includes a first capacitor $C_1$ 550C connected in between the Node G 562 and Node H 564 and a second capacitor $C_2$ 552C connected between Node I 566 and Node J 568. The first capacitor $C_1$ 550C and the second capacitor $C_2$ 552C reduce the voltage drop across the capacitive circuit 520C. The capacitive circuit 520C additionally includes a third capacitor $C_0$ 526C connected between Node H 564 and Node J 568. Finally, the capacitive circuit includes a branch with a variable capacitor $C_V$ 570 connected in parallel between Node H 564 and Node J 568. An example of the variable capacitor $C_V$ 570 is a varactor, which is a voltage controlled capacitor.

In this example, the resonant circuit 510C is designed to resonate at a frequency similar to the source when the human eye is open and there is no parasitic capacitance between the resonant circuit 510C and the eyelid (i.e., $f_R=f_S$). In this configuration, the voltage sensing circuit 532 measures the voltage across Node G 562 and Node I 566 as the parasitic capacitance changes and sends the measured voltage to the control unit 534. The voltage sensing circuit 532 can measure voltages similarly to the voltage sensing circuit of FIG. 5A. The control unit 534 adjusts the capacitance of capacitance circuit 520C by a capacitive increment by changing the capacitance of the variable capacitor 570 to return the resonant circuit 510C to a resonant frequency similar to the source.

Figure 6A:
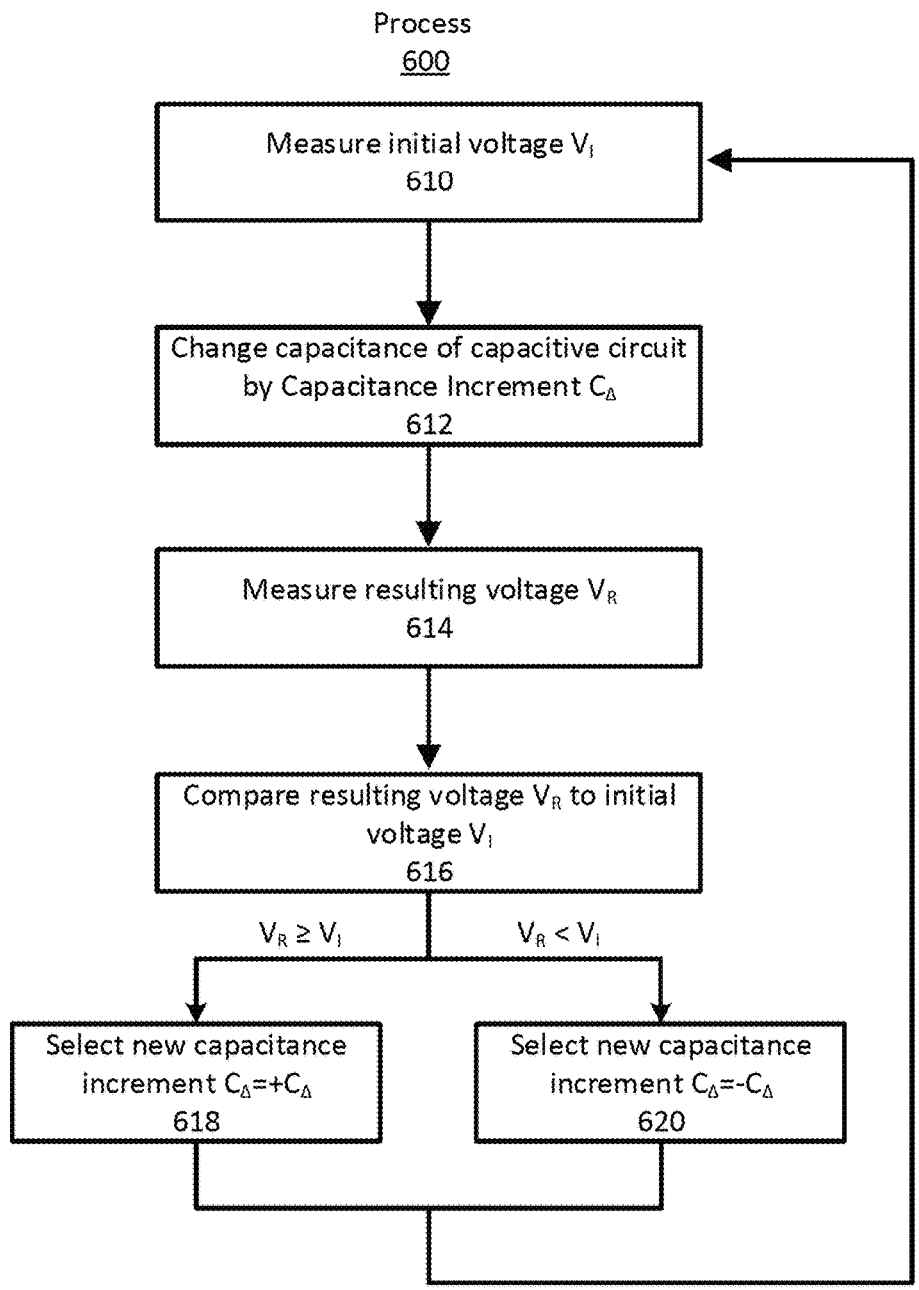
FIGS. 6A-6B show flow diagrams for various techniques for adjusting a resonant frequency of a resonant circuit.
Figure 6B:
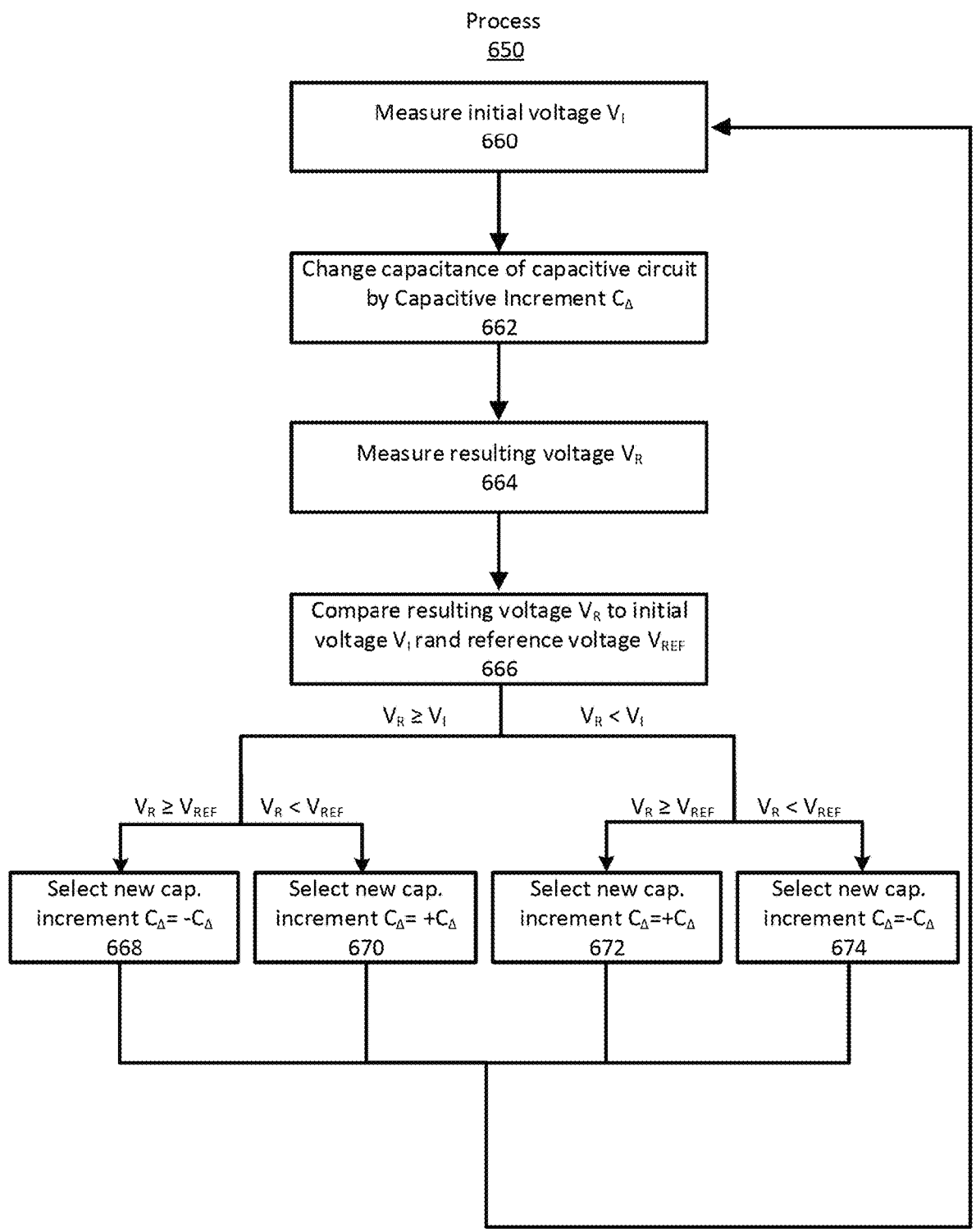

FIGS. 6A-6B are flowcharts illustrating techniques for changing the capacitance of the capacitive circuit of a resonant circuit (e.g., the capacitive circuits 520 of resonant circuits 510 in FIGS. 5A-5C) such that the resonant circuit resonates at a resonant frequency $f_R$ similar to the source frequency $f_S$ as an eye blinks (or the environment changes). In one example, referring to FIGS. 5A-5C, the process can be implemented using the feedback circuit 512. In some configurations feedback circuit 512 can be included on the IC 312 of the contact lens 320. The control unit 534 can be a processor, a circuit, a state machine, or any similar component that can be used to adjust the capacitance of capacitive circuit 520 by capacitance increments. In some configurations, the control unit is included in the IC 312 of the contact lens 320. In other embodiments, the process is executed and implemented by other components of the augmented reality system 100 (such as a coupled electronic device).

The efficiency of power transfer from the source to the resonant circuit is maximized when the impedance of the resonant circuit 510 is maximized and the resonant circuit resonates at the same frequency as a source (e.g., source circuit 260 of necklace 110). Modifying the capacitance of a capacitive circuit 520 of a resonant circuit 510 causes the resonant circuit 510 to resonate at resonant frequency $f_R$ substantially similar to the source frequency $f_S$. In one embodiment, modifying the capacitance of a capacitive circuit includes maximizing the impedance of the resonant circuit 510 or the voltage across the capacitive circuit 520 and inductor $L_0$ 514 (i.e., the conductive coil 330).

FIG. 6A describes a process 600 executed by the feedback circuit 512 to maximize the voltage across the capacitive circuit 520 and the inductor $L_0$ 514. However, in various other embodiments, the process 600 can be used to minimize the voltage, optimize the voltage, minimize or maximize the impedance, optimize the impedance, etc. by appropriately changing the capacitive of the resonant circuit 510 by capacitive increments $C_A$. Further, in various embodiments, the illustrated process 600 can include any number of additional or fewer elements or may execute elements in a different order.

To begin, using FIGS. 5A-5C in example, the voltage sensing circuit 532 measures 610 an initial voltage $V_I$ across the capacitive circuit 520 while the capacitance of the capacitive circuit 520 is at an initial capacitance level. In some cases, the voltage sensing circuit can charge a first comparison capacitor to the initial voltage $V_I$.

The control unit 534 changes 612 the capacitance of the capacitive circuit 520 by a capacitance increment $C_A$, which sets the capacitance to an adjusted capacitance level Herein, a capacitance increment $C_A$ can be noted with "+" and "−" signifying the relative change in capacitance of the capacitive circuit 520. That is, a capacitance increment +$C_A$ is a capacitance increment $C_A$ changing the capacitance of the capacitance circuit 520 from the current capacitance in a similar direction to the previous capacitive increment (e.g., increase again if previously increased, etc.). Similarly, capacitance increment −$C_A$ is a capacitance increment $C_A$ changing the capacitance of the capacitance circuit 520 from the current capacitance in a different direction than the previous capacitance increment (e.g., decrease if previously increased). In one configuration the capacitance increment $C_A$ is the smallest quantized capacitance change possible in the capacitive circuit 520. In other embodiments, the capacitance increment $C_A$ can be any possible capacitance increment of the capacitive circuit 520. In this example, changing the capacitance can include changing the state of one or more switch control signals that control the state of switches in the switched capacitor network 528. Changing the capacitance can also include changing the voltage of a control signal provided to the variable capacitor 570.

The voltage sensing circuit 532 then measures 614 the voltage across the capacitive circuit 520 after the control unit 534 modifies the capacitance of the circuit by the capacitance increment $C_A$ (i.e., the resulting voltage $V_R$). In some cases, the voltage sensing circuit 522 charges a second comparison capacitor to the resulting voltage $V_R$. The voltage sensing circuit 522 compares 616 the resulting voltage $V_R$ to the initial voltage $V_I$. That is, the voltage sensing circuit compares the voltage of the first comparison capacitor to the voltage of the second comparison capacitor to determine a voltage difference. The voltage sensing circuit 522 sends the measured voltage difference (or measured voltages) to the control unit 534.

The control unit 534 selects a new capacitance increment $C_A$ based on the result of the comparison. In one embodiment, if the resulting voltage $V_R$ is greater than or equal to the initial voltage $V_I$ (i.e., $V_R \geq V_I$) 618, the new capacitance increment $C_A$ is in the same direction as the previous capacitive increment $C_A$ (i.e., $C_A=+C_A$). If the resulting voltage $V_R$ is less than the initial voltage $V_I$ (i.e., $V_R<V_I$) 620, the new capacitance increment $C_A$ is in a different direction than the capacitance of the capacitive circuit 520 (i.e., $C_A=-C_A$).

Continuing, the voltage sensing circuit again measures 610 an "initial" voltage $V_I$ (i.e., the measured voltage in this increment of process 600) across the capacitive circuit 520. The control unit 534 adjusts the capacitance of the capacitive circuit 520 by the capacitance increment selected by the control unit (i.e., at 618 or 620). The voltage sensing circuit 532 measures 614 the resulting voltage $V_R$ across the capacitive circuit 520. The voltage sensing circuit 532 then compares 616 the initial voltage $V_I$ to the resulting voltage $V_R$ and selects (i.e., 618 or 620) a new capacitance increment $C_A$ based on the comparison. In this manner, the control unit 534 periodically changes the capacitance of the capacitive circuit 520 to maximize the voltage across the capacitive circuit 520 such that the resonant circuit 510 resonates at a resonant frequency $f_R$ substantially similar to the source frequency $f_S$.

In another embodiment, the control unit 534 adjusts the capacitance of the capacitive circuit while also maintaining the voltage across the capacitive circuit 520 and the inductor $L_0$ 514 at, substantially near, or below a reference voltage $V_{REF}$. Further, maintaining the voltage at a reference voltage $V_{REF}$ can act as a safeguard to prevent large voltage fluctuations (e.g., a runaway voltage or voltage overload) in the resonant circuit 510. FIG. 6B describes a process 650 executed by the feedback circuit 512 to maintain the voltage across the capacitive circuit 520 and inductor $L_0$ 514 at, substantially near, or below the reference voltage $V_{REF}$.

The process 650 of FIG. 6B is largely similar to that of FIG. 6A. That is, the voltage sensing circuit 532 measures 660 an initial voltage $V_I$, the control unit 534 changes 662 the capacitance of the capacitive circuit 520 by a (previously determined) capacitive increment $C_A$, and the voltage sensing circuit 532 measures 664 the resulting voltage $V_R$ similarly to process 600 of FIG. 6A.

However, in the process 650 of FIG. 6B, the control unit 534 compares 666 the resulting voltage $V_R$ to both the initial voltage $V_I$ and the reference voltage $V_{REF}$ and selects a new capacitance increment $C_A$ based on the comparisons. The voltage sensing circuit 532 can compare resulting voltage $V_R$ to both the initial voltage $V_I$ and the reference voltage $V_{REF}$. In one embodiment, if the resulting voltage $V_R$ is greater than or equal to the initial voltage $V_I$ and reference voltage $V_{REF}$ (i.e., $V_R \geq V_I$ and $V_R \geq V_{REF}$) 668, the new capacitance increment $C_A$ is in the opposite direction as the previous capacitance increment $-C_A$ (i.e., $C_A = -C_A$). If the resulting voltage $V_R$ is greater than or equal to the initial voltage $V_I$ but less than the reference voltage $V_{REF}$ (i.e., $V_R > V_I$ and $V_R < V_{REF}$) 670, the new capacitance increment $C_A$ is in the same direction as the previous capacitance increment (i.e., $C_A = +C_A$). If the resulting voltage $V_R$ is less than the initial voltage $V_I$ and greater than or equal to the reference voltage $V_{REF}$ (i.e., $V_R < V_I$ and $V_R > V_{REF}$) 672, the new capacitance increment $C_A$ is in the same direction as the previous capacitance increment (i.e., $C_A = +C_A$). Finally, if the resulting voltage $V_R$ is less than the initial voltage $V_I$ and the reference voltage $V_{REF}$ (i.e., $V_R < V_I$ and $V_R < V_{REF}$) 674, then the new capacitance increment $C_A$ is in the opposite direction of the previous capacitance increment (i.e., $C_A = -C_A$).

Continuing, the voltage sensing circuit again measures 660 an "initial" voltage $V_I$ (i.e., the measured voltage in this iteration of process 600) across the capacitive circuit 520. The control unit 534 changes 662 the capacitance of the capacitive circuit by the capacitance increment $C_A$ previously determined by the control unit 534 (e.g., selected in a previous iteration of process 650). The voltage sensing circuit 532 measures the resulting voltage $V_R$ across the capacitive circuit 520. The voltage sensing circuit 532 then compares the initial voltage $V_I$ and the reference voltage $V_{REF}$ to the resulting voltage $V_R$ and selects a new capacitance increment $C_A$ based on the comparison (i.e., 668, 670, 672, or 674). In this manner, the control unit 534 periodically changes the capacitance of the capacitive circuit 520 to maintain the voltage across the capacitive circuit 520 at the reference voltage. In some cases, maintaining the capacitive circuit at a reference voltage causes the resonant circuit to resonate at a resonant frequency $f_R$ substantially similar to the source frequency $f_S$.

In another similar embodiment, the feedback circuit 512 determines whether the voltage across the capacitive circuit 520 and inductor 514 exceeds a threshold voltage $V_{TH}$, and adjusts the capacitance of the capacitive circuit 520 to decrease the voltage responsive to the voltage exceeding the threshold voltage $V_{TH}$. In this configuration, the control unit 534 may greatly change the capacitance of the capacitive circuit 520 to intentionally change the resonant frequency of the resonant circuit 510 and decrease the voltage drop across the capacitive circuit 520 and inductor $L_0$ 514. This configuration can act as a safeguard to prevent voltage runaway or dangerous voltage levels in the resonant circuit.

Processes 600 and 650 can be initialized in several ways. In a first method, the resonant circuit is configured with a capacitance that is lower than the capacitance required for the resonant circuit to resonate at the source frequency. In this case, when the wearer of the contact lens blinks, the induced parasitic capacitance increases the capacitance of the resonant circuit. The increased capacitance in the resonant circuit causes an increase in the amount of power received by the resonant circuit. The increase in power is used to power the voltage sensing circuit 532 and control unit 534 to begin processes 600 and 650. In a second method, the source can increase the current producing the time varying magnetic field. The increased current causes an increase in the amount of power received by the resonant circuit. The increase in power is used to power the voltage sensing circuit 532 and control unit 534 to begin processes 600 and 650. In this approach, once the processes 600 and 650 have been started the source decreases the current producing the time varying magnetic field.

Although the detailed description contains many specifics, these should not be construed as limiting the scope of the invention but merely as illustrating different examples. It should be appreciated that the scope of the disclosure includes other embodiments not discussed in detail above. Various other modifications, changes, and variations which will be apparent to those skilled in the art may be made in the arrangement, operation and details of the method and apparatus disclosed herein without departing from the spirit and scope as defined in the appended claims. Therefore, the scope of the invention should be determined by the appended claims and their legal equivalents.

In the claims, reference to an element in the singular is not intended to mean "one and only one" unless explicitly stated, but rather is meant to mean "one or more." In addition, it is not necessary for a device or method to address every problem that is solvable by different embodiments of the invention in order to be encompassed by the claims.

The augmented reality system 100 may comprise multiple elements. An element may comprise any physical or logical structure arranged to perform certain operations. Each element may be implemented as hardware, software, or any combination thereof, as desired for a given set of design parameters or performance constraints. Examples of hardware elements may include devices, components, processors, microprocessors, circuits, circuit elements (e.g., transistors, resistors, capacitors, inductors, and so forth), integrated circuits, application specific integrated circuits (ASIC), programmable logic devices (PLD), digital signal processors (DSP), field programmable gate array (FPGA), memory units, logic gates, registers, semiconductor device, chips, microchips, chip sets, and so forth. Examples of software may include any software components, programs, applications, computer programs, application programs, system programs, machine programs, operating system software, middleware, firmware, software modules, routines, subroutines, functions, methods, interfaces, software interfaces, application program interfaces (API), instruction sets, computing code, computer code, code segments, computer code segments, words, values, symbols, or any combination thereof. Although resonant circuits 510 as shown in FIGS. 5A-5C have a limited number of elements in a certain topology, it may be appreciated that the resonant circuits may include more or fewer elements in alternate topologies as desired for a given implementation. The embodiments are not limited in this context.

Depending on the form of the modules, the "connecting" between elements may also take different forms. Dedicated circuitry can be connected to each other by hardwiring or by accessing a common register or memory location, for example. Software "connecting" can occur by any number of ways to pass information between software components (or between software and hardware, if that is the case). The term "connecting" is meant to include all of these and is not meant to be limited to a hardwired permanent connection between two components. In addition, there may be intervening elements. For example, when two elements are described as being connected to each other, this does not imply that the elements are directly connected to each other nor does it preclude the use of other elements between the two.

What is claimed is:

1. A system comprising:
   a contact lens comprising:
      a resonant circuit including:
         a first conductive coil to receive energy from an external source via inductive coupling; and
         a capacitive circuit coupled in parallel to the first conductive coil, the capacitive circuit having a capacitance that is adjustable to control a resonant frequency of the resonant circuit of the contact lens;
      a contact lens display; and
      a load coupled in parallel with the first conductive coil and the capacitive circuit, the load comprising:
         a projector to project images from the contact lens display towards a human retina based on data received wirelessly by the contact lens display; and
         an energy recovery circuit to recover energy from the resonant circuit and to provide provide power for the projector.

2. The system of claim 1, wherein the external source comprises a series RLC circuit having a resonant frequency that is substantially same as the resonant frequency of the resonant circuit of the contact lens.

3. The system of claim 1, wherein the external source is a wearable device including a second conductive coil to inductively couple to the first conductive coil by providing a time varying magnetic field to the first conductive coil.

4. The system of claim 3, wherein the wearable device is a necklace and the second conductive coil extends around a perimeter of the necklace and is configured to inductively couple to the first conductive coil of the contact lens.

5. The system of claim 1, wherein the capacitive circuit comprises:
   a switched capacitor network having a plurality of parallel branches, each parallel branch including a corresponding switch in series with a corresponding capacitor, wherein a state of each switch adjusts the capacitance of the capacitive circuit.

6. The system of claim 5, wherein at least a subset of the capacitors in the switched capacitor network have capacitance values that follow a binary coded decimal (BCD) pattern.

7. The system of claim 1, wherein the capacitive circuit includes a variable capacitor having a capacitance that is varied to adjust the capacitance of the capacitive circuit.

8. A system comprising:
   a contact lens comprising a resonant circuit, the resonant circuit including:
      a first conductive coil to receive energy from an external source via inductive coupling; and
      a capacitive circuit coupled in parallel to the first conductive coil, the capacitive circuit having a capacitance that is adjustable to control a resonant frequency of the resonant circuit of the contact lens, wherein the capacitive circuit includes:
         a first node,
         a second node,
         a first capacitor connected between the first node and the second node, and
         a switched capacitor network or variable capacitor connected between the first node and the second node, wherein the capacitance of the capacitive circuit corresponds to a combined capacitance of at least the first capacitor, and the switched capacitor network or the variable capacitor.

9. A system comprising:
   a contact lens comprising a resonant circuit, the resonant circuit including:
      a first conductive coil to receive energy from an external source via inductive coupling; and a capacitive circuit coupled in parallel to the first conductive coil, the capacitive circuit having a capacitance that is adjustable to control a resonant frequency of the resonant circuit of the contact lens, wherein the capacitive circuit comprises:
         a first node, a second node, a third node, and a fourth node;
         a first capacitor connected between the first node and the second node,
         a second capacitor connected between the third node and the fourth node, and
         a switched capacitor network or variable capacitor connected between the second node and the third node, wherein the capacitance of the capacitive circuit corresponds to a combined capacitance of at least the first capacitor, second capacitor, third capacitor, and the switched capacitor network or the variable capacitor.

10. The system of claim 1, the contact lens further comprising:
    a feedback circuit to receive a feedback signal indicative of a voltage across the first conductive coil and to adjust the capacitance of the capacitive circuit based on the feedback signal indicative of the voltage across the first conductive coil.

11. The system of claim 10, the feedback circuit to adjust the capacitance of the capacitive circuit such that the resonant frequency of the resonant circuit is maintained at a substantially constant frequency.

12. The system of claim 10, the feedback circuit to adjust the capacitance of the capacitive circuit to maximize the voltage across the second conductive coil.

13. The system of claim 10, the feedback circuit to measure a first voltage across the first conductive coil when the capacitance is adjusted to a first capacitance level;
    measure a second voltage across the first conductive coil when the capacitance is adjusted to a second capacitance level;
    compare the first voltage to the second voltage; and
    adjust the capacitance of the capacitive circuit based on a result of comparing the first voltage and the second voltage.

14. The system of claim 10, the feedback circuit to compare the voltage across the first conductive coil to a reference voltage, and to adjust the capacitance based on a result of comparing the voltage to the reference voltage.

15. The system of claim 1, wherein the first conductive coil extends along a peripheral region of the contact lens display, and the projector is located in a region of the contact lens display that is surrounded by the first conductive coil.

16. The system of claim 8, wherein branches of the switched capacitor network follow a binary coded decimal pattern.

17. The system of claim 8, wherein:
the switched capacitor network comprises a plurality of branches;
each branch in the plurality of branches comprises a switch and a capacitor;
each switch comprises an open state and a closed state, with the closed state connecting the capacitor on its branch to the switched capacitor network and the closed state disconnecting the capcitor on its branch from the switched capacitor network; and
the capacitive circuit controls the resonant frequency of the resonant circuit by adjusting one or more of the switches from closed to open, or open to closed.

18. The system of claim 8, wherein the capacitive circuit adjusts its capacitance to control the resonant frequency of the resonant circuit of the contact lens when a wearer of the contact lens blinks their eye.

19. The system of claim 9, wherein:
the switched capacitor network comprises a plurality of branches;
each branch in the plurality of branches comprises a switch and a capacitor;
each switch comprises an open state and a closed state, with the closed state connecting the capacitor on its branch to the switched capacitor network and the closed state disconnecting the capcitor on its branch from the switched capacitor network; and
the capacitive circuit controls the resonant frequency of the resonant circuit by adjusting one or more of the switches from closed to open, or open to closed.

20. The system of claim 9, wherein the capacitive circuit adjusts its capacitance to control the resonant frequency of the resonant circuit of the contact lens when a wearer of the contact lens blinks their eye.

* * * * *